(12) United States Patent
Pham et al.

(10) Patent No.: US 10,820,439 B2
(45) Date of Patent: Oct. 27, 2020

(54) SEALING STRUCTURE AND ELECTRONIC DEVICE INCLUDING THE SAME

(71) Applicant: Samsung Electronics Co., Ltd., Gyeonggi-do (KR)

(72) Inventors: Dong Pham, Yen Phong District (VN); Tuan Van Nguyen, Yen Phong District (VN); Thao Hoang Nguyen, Yen Phong District (VN); Thai Quoc Pham, Yen Phong District (VN); Thuy Thi Le, Yen Phong District (VN); Hoang Duy Trieu, Yen Phong District (VN)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 16/700,741

(22) Filed: Dec. 2, 2019

(65) Prior Publication Data
US 2020/0178411 A1 Jun. 4, 2020

(30) Foreign Application Priority Data
Nov. 30, 2018 (KR) .......................... 10-2018-0151724

(51) Int. Cl.
| H05K 5/06 | (2006.01) |
| H01R 13/52 | (2006.01) |
| H05K 5/00 | (2006.01) |
| H01R 13/516 | (2006.01) |

(52) U.S. Cl.
CPC .......... H05K 5/069 (2013.01); H01R 13/516 (2013.01); H01R 13/5202 (2013.01); H05K 5/0069 (2013.01); H05K 5/061 (2013.01)

(58) Field of Classification Search
CPC . G06F 1/1656; H01R 13/516; H01R 13/5202; H04M 1/02; H04M 1/18; H05K 5/0069; H05K 5/061; H05K 5/069
See application file for complete search history.

(56) References Cited

U.S. PATENT DOCUMENTS

| 8,804,354 | B2 * | 8/2014 | Golko .................. H01R 13/516 361/756 |
| 9,529,387 | B2 * | 12/2016 | Carnevali ............. G06F 1/1628 |
| 9,991,625 | B2 * | 6/2018 | Ozaki ................ H01R 13/5202 |
| 10,433,437 | B2 * | 10/2019 | Baek ...................... H01Q 1/243 |
| 10,547,140 | B2 * | 1/2020 | Lee ....................... H01R 13/521 |
| 10,588,230 | B2 * | 3/2020 | Yamaguchi ............ H05K 5/061 |

(Continued)

*Primary Examiner* — Abhishek M Rathod
(74) *Attorney, Agent, or Firm* — The Farrell Law Firm, P.C.

(57) ABSTRACT

An electronic device is provided, which includes a printed circuit board (PCB), a housing receiving the PCB and including a through-hole connected to an outside of the electronic device, an electronic component connected with the PCB and accessible from the outside via the through-hole, and a sealing member disposed between a surrounding of the through-hole and the electronic component and shaped as a closed loop. The housing includes a sealing area disposed inside the housing along the surrounding of the through-hole and contacting the sealing member, a rib projecting towards an inside of the housing from an end of the sealing member, supporting the electronic component, and limiting movement of the electronic component by an external force, and a recess formed in an area of the rib, at least a portion of the recess that is flush with a surface of the sealing area.

20 Claims, 17 Drawing Sheets

(56) References Cited

U.S. PATENT DOCUMENTS

| | | | | |
|---|---|---|---|---|
| 10,700,483 | B1* | 6/2020 | Piper | H01R 31/06 |
| 2009/0130875 | A1* | 5/2009 | Guo | H01R 13/506 |
| | | | | 439/141 |
| 2010/0099279 | A1* | 4/2010 | Homme | H05K 5/069 |
| | | | | 439/78 |
| 2013/0250504 | A1* | 9/2013 | Choi | G06F 1/203 |
| | | | | 361/679.26 |
| 2013/0330951 | A1* | 12/2013 | Yudate | H01R 13/5202 |
| | | | | 439/271 |
| 2014/0104795 | A1* | 4/2014 | Wee | G06F 1/183 |
| | | | | 361/752 |
| 2015/0380862 | A1* | 12/2015 | Song | H01R 24/62 |
| | | | | 439/559 |
| 2016/0044816 | A1* | 2/2016 | Jarvis | H01H 23/04 |
| | | | | 361/759 |
| 2018/0166809 | A1* | 6/2018 | Brogan | G06F 1/1637 |
| 2018/0294598 | A1* | 10/2018 | Lee | H01R 13/5213 |
| 2020/0176920 | A1* | 6/2020 | Jo | H01R 13/631 |

* cited by examiner

SEALING STRUCTURE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2018-0151724, filed on Nov. 30, 2018, in the Korean Intellectual Property Office, the entire disclosure of which is incorporated herein by reference.

BACKGROUND

1. Field

The disclosure relates generally to a sealing structure and an electronic device including the sealing structure.

2. Description of Related Art

The term "electronic device" may mean a device performing a particular function according to its equipped program, such as a home appliance, an electronic scheduler, a portable multimedia player, a mobile communication terminal, a tablet personal computer (PC), a video/sound device, a desktop PC, a laptop computer, a navigation device for an automobile, etc. For example, electronic devices may output stored information as voices or images.

As electronic devices are highly integrated, and high-speed, high-volume wireless communication becomes commonplace, an electronic device, such as a mobile communication terminal, is often equipped with various functions. For example, an electronic device comes with the integrated functionality, including an entertainment function, such as playing video games, a multimedia function, such as replaying music/videos, a communication and security function for mobile banking, and a scheduling or e-wallet function.

An electronic device may include an electronic component for wiredly or wirelessly communicating with the outside. The electronic component may have a structure for sealing off the surroundings, i.e., preventing a foreign body, such as dirt, from entering the electronic component and/or electronic device.

An electronic component (e.g., a universal serial bus (USB) module) inside an electronic device may be disposed adjacent to a through-hole of the electronic device for communicating with the outside. If the electronic component is assembled at one area of the electronic device, the distance between the coupling portion where the electronic component is fixed and the sealing area may be measured to implement a sealing function. However, the internal structure of the housing in the electronic device may limit measurement of the distance between the coupling portion and the sealing area. Consequently, as the electronic component is assembled in a position with an error range, the sealability may be deteriorated.

After the electronic component has been assembled in the position within the error range, a result of a waterproof test may be identified. If failing in the waterproof test, the sealing structure may not be used as a product, incurring a waste of time, material, and cost.

SUMMARY

The disclosure is provided to address at least the problems and/or disadvantages described above and to provide at least the advantages described below.

An aspect of the disclosure is to provide a sealing structure of an electronic device that allows measurement between a sealing area and a coupling portion for fastening the electronic component.

In accordance with an aspect of the disclosure, an electronic device is provided, which includes a printed circuit board (PCB), a housing receiving the PCB and including a through-hole connected to an outside of the electronic device, an electronic component connected with the PCB and accessible from the outside via the through-hole, and a sealing member disposed between a surrounding of the through-hole and the electronic component and shaped as a closed loop. The housing includes a sealing area disposed inside the housing along the surrounding of the through-hole and for contacting the sealing member, a rib projecting towards an inside of the housing from an end of the sealing member, supporting the electronic component, and limiting movement of the electronic component by an external force, and a recess formed in an area of the rib, at least a portion of the recess being flush with a surface of the sealing area.

In accordance with another aspect of the disclosure, an electronic device is provided, which includes a front plate facing in a first direction, a rear plate facing in a second direction opposite to the first direction, a printed circuit board (PCB), a sealing structure disposed between the front plate and the rear plate and including a through-hole for connecting with an outside of the electronic device, an electronic component connected with the PCB and accessible from the outside through the through-hole, and a sealing member disposed between a surrounding of the through-hole and the electronic component and shaped as a closed loop. The sealing structure includes a seating space for seating the electronic component, a coupling part for fastening the electronic component to the seating space, a sealing area disposed along the surrounding of the through-hole and for sealing the electronic component from an outside of the electronic component, a rib disposed on a side surface of the sealing area and projecting from the sealing area, and at least one recess disposed on the same line as at least a portion of the rib.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
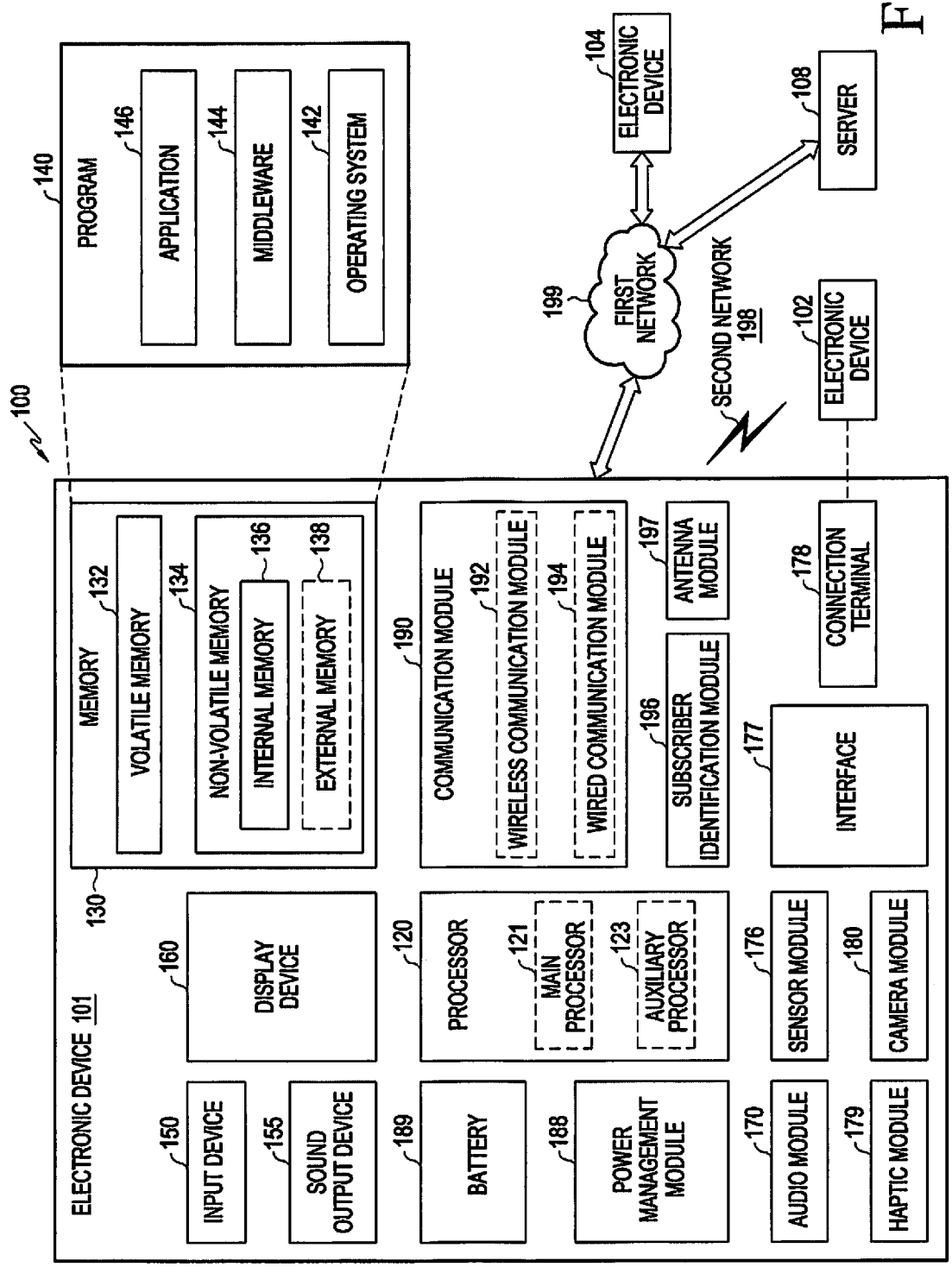
FIG. 1 illustrates an electronic device in a network environment according to an embodiment.

Various embodiments of the disclosure will now be described in detail with reference to the accompanying drawings. In the following description, specific details such as detailed configuration and components are merely provided to assist the overall understanding of these embodiments. Therefore, it should be apparent to those skilled in the art that various changes and modifications of the embodiments described herein can be made without departing from the scope and spirit of the disclosure. In addition, descriptions of well-known functions and constructions are omitted for clarity and conciseness.

Throughout the drawings, like reference numerals may be understood to refer to like parts, components, and structures.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. Alternatively, at least one (e.g., the display device 160 or the camera module 180) of the components may be omitted from the electronic device 101, or one or more other components may be added in the electronic device 101. Some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, e.g., software (e.g., a program 140) to control at least one other component (e.g., a hardware or software component) of the electronic device 101 connected with the processor 120 and may process or compute various data. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134.

The processor 120 includes a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one (e.g., the display device 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include software (e.g., the program 140) and input data or output data for a command related thereto. The memory 130 includes the volatile memory 132 and the non-volatile memory 134.

The program 140 may be stored in the memory 130 as software, and includes, for example, an operating system (OS) 142, middleware 144, and an application 146.

The input device 150 may receive a command or data to be used by another component (e.g., the processor 120) of the electronic device 101, from the outside (e.g., a user) of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for an incoming calls. The receiver may also be implemented as being separate from, or as part of the speaker.

The display device 160 may visually provide information to the outside (e.g., a user) of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain a sound through the input device 150 or output a sound through the sound output device 155 or an external electronic device (e.g., an electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). The connecting terminal 178 may include an HDMI connector, a USB connector, a SD card connector, and/or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. The haptic module 179 may include a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 388 may be implemented as at least part of, for example, a power management integrated circuit (PMIC).

The battery 189 may supply power to at least one component of the electronic device 101. The battery 189 may include a primary cell which is not rechargeable, a secondary cell which is rechargeable, and/or a fuel cell.

The communication module 190 may support establishing a direct (e.g., wired) communication channel or wireless communication channel between the electronic device 101 and an external electronic device (e.g., the electronic device 102, the electronic device 104, or the server 108) and performing communication through the established communication channel. The communication module 190 may include one or more communication processors that are operable independently from the processor 120 (e.g., the application processor (AP)) and supports a direct (e.g., wired) communication or a wireless communication. The communication module 190 includes a wireless communication module 192 (e.g., a cellular communication module, a short-range wireless communication module, or a global navigation satellite system (GNSS) communication module) and a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. The antenna module may include one antenna including a radiator formed of a conductor or conductive pattern formed on a substrate (e.g., a PCB). The antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. Alternatively, other parts (e.g., radio frequency integrated circuit (RFIC)) than the radiator may be further formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. The first and second external electronic devices 102 and 104 each may be a device of the same or a different type from the electronic device 101.

All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices, such as a portable communication device (e.g., a smart phone), a computer device, a portable multimedia device, a portable medical device, a camera, a wearable device, or a home appliance. However, the electronic device is not limited to the above-listed devices.

Various embodiments of the disclosure and the terms used therein are not intended to limit the technological features set forth herein to particular embodiments and include various changes, equivalents, or replacements for a corresponding embodiment.

A singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Further, such terms as "1st" and "2nd," or "first" and "second" may be used to simply distinguish a corresponding component from another, and does not limit the components in other aspect (e.g., importance or order).

If an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. O or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

A partial configuration of the electronic device may have an injection-molded surface resulting from injection molding. The injection-molded surface formed by the injection molding structure may include an outer surface of the electronic device or may support various electronic components inside the electronic device.

Figure 2A:
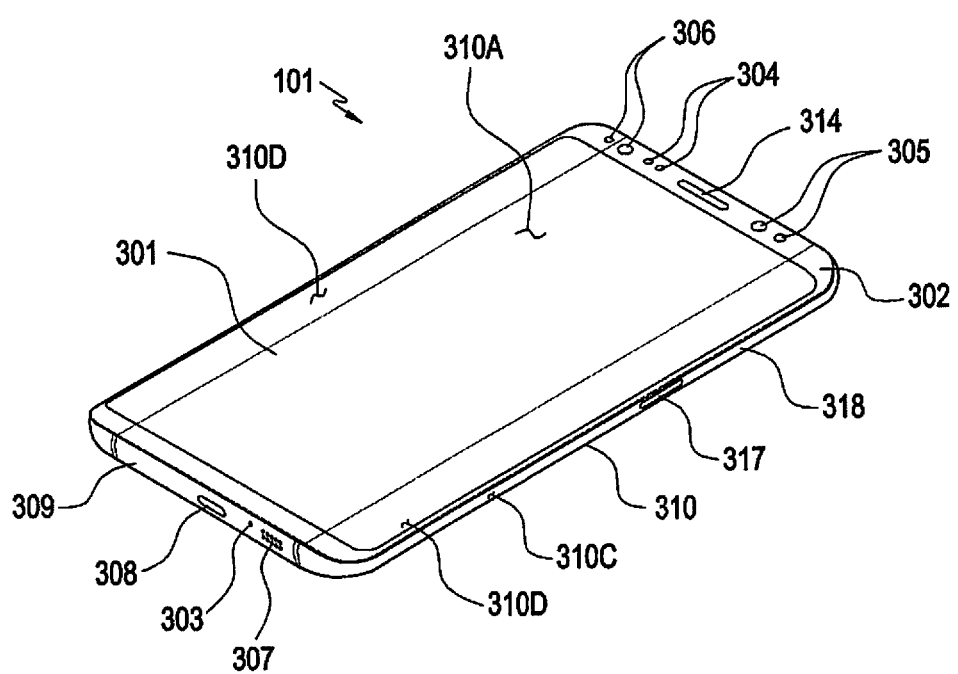
FIG. 2A illustrates an electronic device according to an embodiment.
Figure 2B:
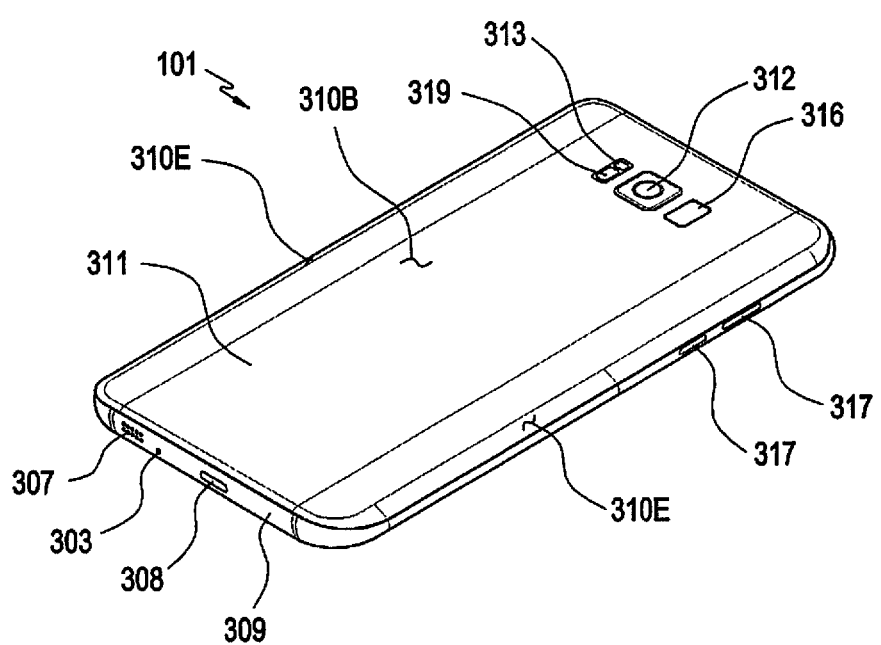
FIG. 2B illustrates an electronic device according to an embodiment.

FIGS. 2A and 2B illustrate an electronic device 101 according to an embodiment. Specifically, FIG. 2A illustrates a front perspective view of the electronic device 101, and FIG. 2B illustrates a rear perspective view of the electronic device 101.

Referring to FIGS. 2A and 2B, the electronic device 101 includes a housing 310 with a first (or front) surface 310A, a second (or rear) surface 310B, and a side surface 310C surrounding a space between the first surface 310A and the second surface 310B. The housing may denote a structure forming part of the first surface 310A, the second surface 310B, and the side surface 310C of FIG. 2A. At least part of the first surface 310A may have a substantially transparent front plate 302 (e.g., a glass plate or polymer plate including various coat layers). The second surface 310B may be formed of a substantially opaque rear plate 311. The rear plate 311 may be formed of laminated or colored glass, ceramic, polymer, metal (e.g., aluminum, stainless steel (STS), or magnesium), or a combination of at least two thereof. The side surface 310C may be formed by a side bezel structure (or a "side member") 318 that couples to the front plate 302 and the rear plate 311 and includes a metal and/or polymer. The rear plate 311 and the side bezel plate 318 may be integrally formed together and include the same material (e.g., a metal, such as aluminum).

The front plate 302 may include two first regions 310D, which seamlessly and bendingly extend from the first surface 310A to the rear plate 311, on both the long edges of the front plate 302. The rear plate 311 may include second regions 310E, which seamlessly and bendingly extend from the second surface 310B to the front plate, on both the long edges. The front plate 302 (or the rear plate 311) may include only one of the first regions 310 (or the second regions 310E). Alternatively, the first regions 310D or the second regions 301E may partially be excluded. At side view of the electronic device 101, the side bezel structure 318 may have a first thickness (or width) for sides that do not have the first regions 310D or the second regions 310E and a second thickness, which is smaller than the first thickness, for sides that have the first regions 310D or the second regions 310E.

The electronic device 101 may include at least one or more of a display 301, audio modules 303, 307, and 314, sensor modules 304, 316, and 319, camera modules 305, 312, and 313, key input devices 317, a light emitting device 306, and connector holes 308 and 309. The electronic device 101 may exclude at least one (e.g., the key input device 317 or the light emitting device 306) of the components or may add other components.

The display 301 may be exposed through, e.g., a majority portion of the front plate 302. At least a portion of the display 301 may be exposed through the front plate 302 forming the first surface 310A and the first regions 310D of the side surface 310C. The edge of the display 301 may be formed to be substantially the same in shape as an adjacent outer edge of the front plate 302. The interval between the outer edge of the display 301 and the outer edge of the front plate 302 may remain substantially even to give a larger area of exposure the display 301.

The screen display region of the display 301 may have a recess or opening in a portion thereof, and at least one or more of the audio module 314, sensor module 304, camera module 305, and light emitting device 306 may be aligned with the recess or opening. At least one or more of the audio module 314, sensor module 304, camera module 305, fingerprint sensor 316, and light emitting device 306 may be included on the rear surface of the screen display region of the display 301. The display 301 may be disposed to be coupled with, or adjacent, a touch detecting circuit, a pressure sensor capable of measuring the strength (pressure) of touches, and/or a digitizer for detecting a magnetic field-type stylus pen. At least part of the sensor modules 304 and 519 and/or at least part of the key input device 317 may be disposed in the first regions 310D and/or the second regions 310E.

The audio modules 303, 307, and 314 may include a microphone hole 303 and speaker holes 307 and 314. The microphone hole 303 may have a microphone inside to obtain external sounds. There may be a plurality of microphones that detect the direction of a sound. The speaker holes 307 and 314 may include an external speaker hole 307 and a phone receiver hole 314. The speaker holes 307 and 314 and the microphone hole 303 may be implemented as a single hole, or speakers may be rested without the speaker holes 307 and 314 (e.g., piezo speakers).

The sensor modules 304, 316, and 319 may generate an electrical signal or data value corresponding to an internal operating state or external environmental state of the electronic device 101. The sensor modules 304, 316, and 319 may include a first sensor module 304 (e.g., a proximity sensor) and/or a second sensor module (not shown) (e.g., a fingerprint sensor) disposed on the first surface 310A of the housing 310 and/or a third sensor module 319 (e.g., a heart-rate monitor (HRM) sensor) and/or a fourth sensor module 316 (e.g., a fingerprint sensor) disposed on the second surface 310B of the housing 310. The fingerprint sensor may be disposed on the second surface 310B as well as on the first surface 310A (e.g., the display 301) of the housing 310. The electronic device 101 may further include sensor modules, such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and/or an illuminance sensor.

The camera modules 305, 312, and 313 may include a first camera device 305 disposed on the first surface 310A of the electronic device 101, and a second camera device 312 and/or a flash 313 disposed on the second surface 310B. The camera modules 305 and 312 may include one or more lenses, an image sensor, and/or an image signal processor. The flash 313 may include, e.g., a light emitting diode (LED) or a xenon lamp. Two or more lenses (an infrared (IR) camera, a wide-angle lens, and a telescopic lens) and image sensors may be disposed on one surface of the electronic device 101.

The key input device 317 may be disposed on the side surface 310C of the housing 310. The electronic device 101 may exclude all or some of the above-mentioned key input devices 317 and the excluded key input devices 317 may be implemented in other forms, e.g., as soft keys, on the display 301. The key input device may include the sensor module 316 disposed on the second surface 310B of the housing 310.

The light emitting device 306 may be disposed on the first surface 310A of the housing 310. The light emitting device 306 may provide information about the state of the electronic device 101 in the form of light. The light emitting device 306 may provide a light source that interacts with the camera module 305. The light emitting device 306 may include an LED, an infrared (IR) LED, or a xenon lamp.

The connector holes 308 and 309 may include a first connector hole 308 for receiving a connector (e.g., a USB connector) for transmitting or receiving power and/or data to/from an external electronic device and/or a second connector hole 309 (e.g., an earphone jack) for receiving a connector for transmitting or receiving audio signals to/from the external electronic device.

Figure 3:
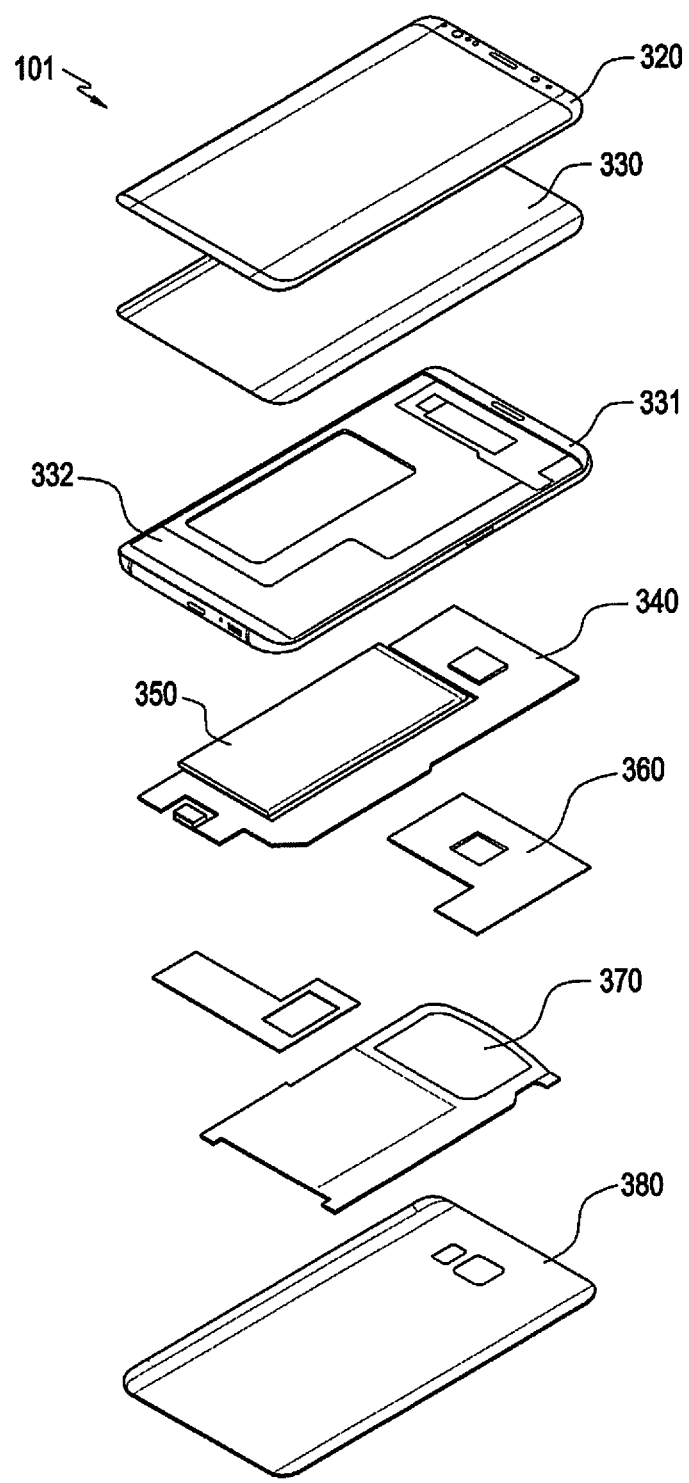
FIG. 3 illustrates an exploded view of an electronic device according to an embodiment.

FIG. 3 illustrates an electronic device according to an embodiment.

Referring to FIG. 3, the electronic device 101 includes a side bezel structure 331, a first supporting member 332 (e.g., a bracket), a front plate 320, a display 330, a printed circuit board (PCB) 340, a battery 350, a second supporting member 360 (e.g., a rear case), an antenna 370, and a rear plate 380. The electronic device 101 may exclude at least one (e.g., the first supporting member 332 or the second supporting member 360) of the components or may add other components. At least one of the components of the electronic device 101 may be the same or similar to at least one of the components of FIG. 2A or 2B and no duplicate description is made below.

The first supporting member 332 may be disposed inside the electronic device 101 to be connected with the side bezel structure 331 or integrated with the side bezel structure 331. The first supporting member 332 may be formed of a metal and/or non-metallic material (e.g., a polymer). The display 330 may be joined onto one surface of the first supporting member 332, and the printed circuit board 340 may be joined onto the opposite surface of the first supporting member 311. A processor, memory, and/or interface may be mounted on the printed circuit board 340. The processor may include one or more of a central processing unit, an application processor, a graphic processing device, an image signal processing, a sensor hub processor, or a communication processor.

The memory may include a volatile or non-volatile memory.

The interface may include an HDMI, a USB interface, an SD card interface, and/or an audio interface. The interface may electrically or physically connect the electronic device 101 with an external electronic device and may include a USB connector, an SD card/multimedia card (MMC) connector, and/or an audio connector.

The battery 350 may be a device for supplying power to at least one component of the electronic device 101. The battery 189 may include a primary cell which is not rechargeable, a secondary cell which is rechargeable, and/or a fuel cell. At least a portion of the battery 350 may be disposed on substantially the same plane as the printed circuit board 340. The battery 350 may be integrated or detachably disposed inside the electronic device 101.

The antenna 370 may be disposed between the rear plate 380380 and the battery 350. The antenna 370 may include a near-field communication (NFC) antenna, a wireless charging antenna, and/or a magnetic secure transmission (MST) antenna. The antenna 370 may perform short-range communication with an external device or may wirelessly transmit or receive power necessary for charging. An antenna structure may be formed by a portion or combination of the side bezel structure 331 and/or the first supporting member 332.

Figure 4A:
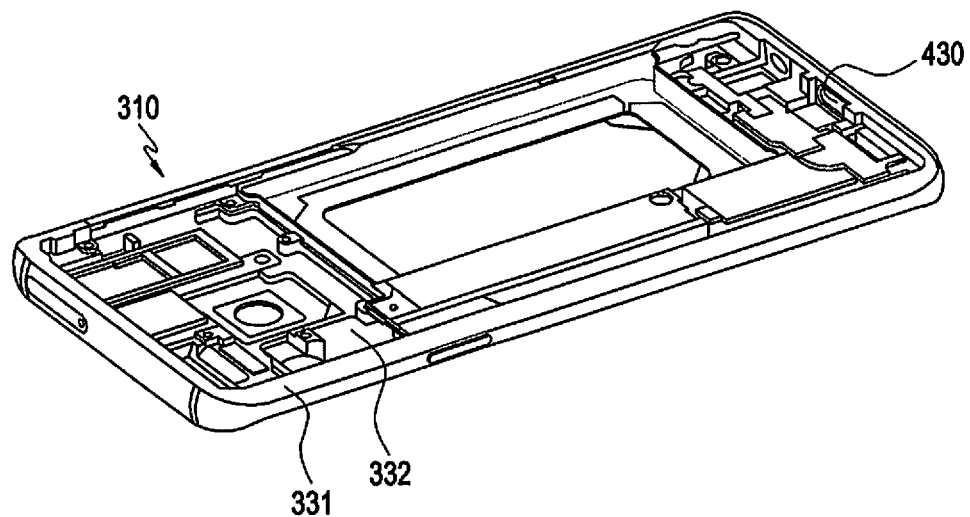
FIG. 4A illustrates a bracket and a side bezel structure of an electronic device as viewed in one direction according to an embodiment.
Figure 4B:
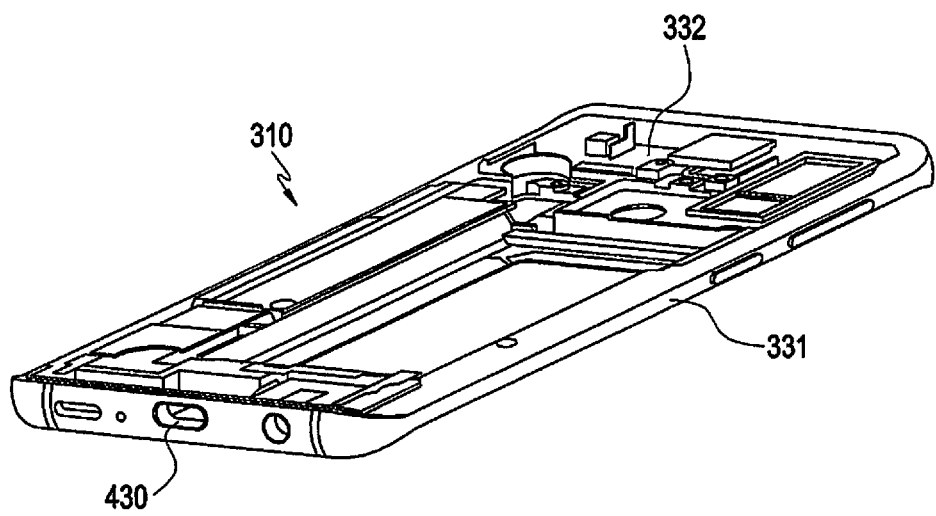
FIG. 4B illustrates a bracket and a side bezel structure of an electronic device as viewed in another direction according to an embodiment.
Figure 5:
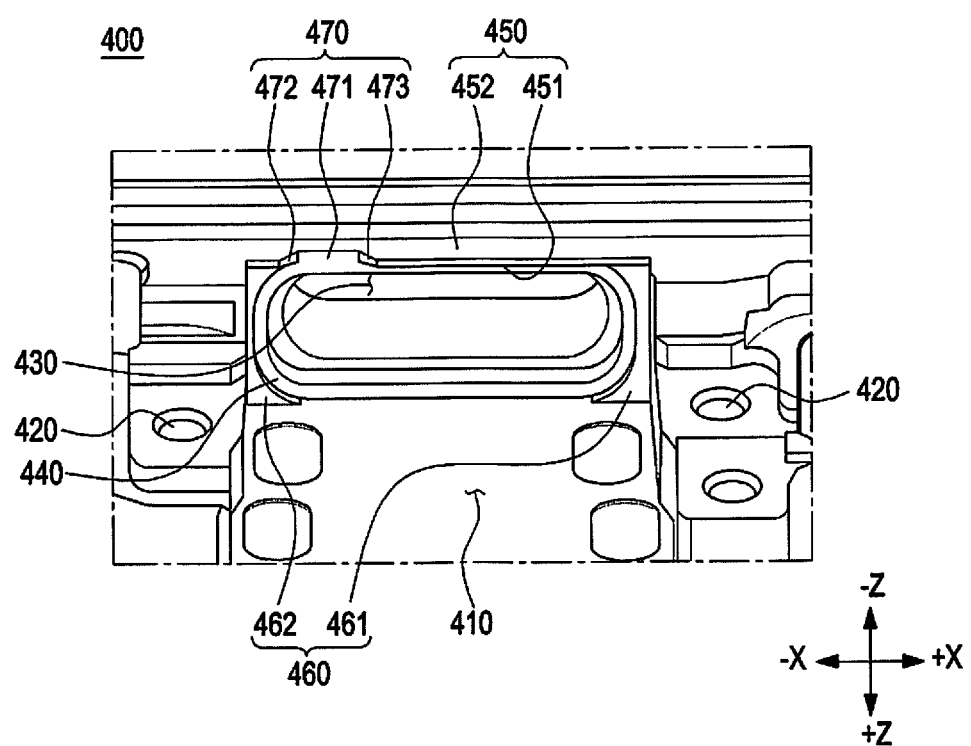
FIG. 5 illustrates an inner surface of a bracket as an enlarged view of an area of FIGS. 4A and 4B according to an embodiment.

FIG. 4A illustrates a bracket and a side bezel structure of an electronic device as viewed in one direction according to an embodiment. FIG. 4B illustrates a bracket and a side bezel structure of an electronic device as viewed in another direction according to an embodiment. FIG. 5 illustrates an inner surface of a bracket as an enlarged view of an area of FIGS. 4A and 4B according to an embodiment.

Referring to FIGS. 4A, 4B, and 5, an electronic device includes a housing 310 for mounting electronic components. The housing 310 includes a side bezel structure 331 and a bracket 332. The side bezel structure 331 and the bracket 332 may be integrally formed with each other. The side bezel structure 331 and bracket 332 of FIGS. 4A and 5 may be identical in whole or part to the side bezel structure 331 and first supporting member 332 of FIG. 3.

The bracket 332 provides a space for receiving a plurality of electronic components. The side bezel structure 331 may be formed to surround at least a portion of the bracket 332, covering a side surface of the electronic device 101. To cover the internal space where the plurality of electronic components are received, the bracket 332 and the side bezel structure 331 may be connected forward to a display and a front plate and backward to a rear plate.

A sealing structure 400 may be provided in an area inside the bracket 332 to seat at least one electronic component and prevent a foreign body from getting inside of the electronic device. For example, the sealing structure 400 may block entry of a foreign body and/or moisture through the space between the electronic component and the housing 310. The electronic component may be a USB module capable of wiredly or wirelessly transmitting/receiving power or data to/from the outside of the electronic device.

The sealing structure 400 includes a seating space 410 for seating the USB module, a coupling part 420 for fastening the USB module to the bracket 332, at least one through-hole 430 for allowing the USB module to communicate with the outside of the electronic device 101, and a sealing area 440 in which a sealing member 490 (e.g., the sealing member 490 of FIG. 7B) for sealing the USB module off the outside of the electronic device 101 is disposed. As an example, the sealing structure 400 may include a rib 450 for supporting the USB module and limiting movement of the USB module by an external force and at least one recess 470 disposed on the same line as at least a portion of the rib 450.

The at least one through-hole 430 may be disposed to pass from the seating space 410 through the bracket 332 and the side bezel structure 331. The through-hole 430 may connect the USB module with the outside. For example, a plug connector of an external device may be inserted through the through-hole 430, electrically connecting to the USB module. The at least one through-hole 430 may include an inside portion which faces the inside of the housing 310 and an outside portion which faces the outside of the housing 310. The inside portion may be formed, as a portion of the bracket 332, of a non-metallic material, and the outside portion may be formed, as a portion of the side bezel structure 331, of a metal.

The seating space 410 may be disposed adjacent to the through-hole 430 and may provide a space for seating the USB module. At least a portion of the USB module, which faces the outside of the electronic device, may be disposed to face the through-hole 430 to connect to the plug connector of the external device, and at least a portion of the bottom and side surface of the USB module may be disposed to be surrounded by the seating space 410 of the bracket 332. For example, at least a portion of the bottom and side surface of the USB module may be inserted into the seating space 410, which is shaped as a hole, and may thus be supported stably. The seating space 410 may be positioned in a portion of the bracket 332 and be formed of a non-metallic material.

The coupling part 420 may be disposed adjacent to the seating space 410 and may fasten the USB module disposed in the seating space 410. The coupling part 420 may be designed in various structures which are able to fasten a coupling portion that projects to the outside of the USB module. For example, a plurality of coupling parts 420 may be provided which are positioned on both sides of the seating space 410. The coupling part 420 may be formed of a hole corresponding to a hole disposed in the coupling portion. The hole may guide fastening to the coupling portion via a coupler, e.g., a screw.

As an example, the hole may guide fastening of the coupling portion and the coupling part via an attaching material, e.g., a tape or an adhesive. For the area in which the coupling part 420 is formed, a precise position needs to be set to prevent movement of the USB module and entry of a foreign body into the inside of the electronic device upon manufacture. Since the positioning of the coupling part 420 is adjusted depending on a predetermined distance spaced apart from the sealing area 440, it may be influenced from the recess 470 which is flush with the sealing area 440. The positioning of the coupling part 420 will be described in more detail below.

The sealing area 440 may be disposed to face one side surface of the USB module, with the sealing member disposed therebetween. The sealing area 440 may be formed to surround at least a portion of the surroundings of the through-hole 430. For example, the sealing area 440 may be disposed to correspond to the shape of the sealing member. The sealing area 440 may be shaped as a closed loop. The sealing area 440 may be formed with substantially four side surfaces to correspond to the shape of the sealing member.

The sealing area 440 may be disposed inside the bracket 332, not to be exposed to the outside. The through-hole 430 may be disposed inside the sealing area 440. Side walls 460 and/or the rib 450 may be disposed outside the sealing area 440 to support the sealing member and prevent escaping off the designated position.

The sealing area 440 may be an area for seating the sealing member and may be a designated size broader than the area of contact of the sealing member. For example, such a size of the sealing area 440 is intended for receiving the area of contact of the sealing area 440, which increases as the sealing member is compressed to allow the sealing area 440 to overlap the USB module. The sealing area 440 may be positioned in a portion of the bracket 332 and be formed of a non-metallic material.

The rib 450 may be disposed on one side (e.g., a second direction (−Z axis direction)) of the sealing area 440. The rib 450 may project at a designated thickness to the inside of the electronic device. The rib 450 may be disposed along at least a surrounding of the through-hole 430. The projecting shape of the rib 450 may include a first surface 451 which faces in the first direction (+Z axis direction) and a second surface 452 which faces in the second direction (−Z axis direction) opposite to the first direction (+Z axis direction). The second surface 452 may provide an area that extends from the surrounding bracket 332 and side bezel structure 331 to support and attach the edge of the rear plate. The first surface 451 may provide a seating area that faces at least a portion of the outer surface of the USB module and the sealing member to stably position the USB module and the sealing member. For example, the first surface 451 may be disposed to surround at least a portion of the outer surface facing in the second direction (−Z axis direction) of the USB module, supporting the USB module and preventing movement of the USB module by an external force. The first surface 451 may be disposed to be partially spaced apart from or contact the outer surface facing in the second direction (−Z axis direction) of the sealing member and, if the sealing member is compressed and thus expanded by, e.g., an external force, prevent it from deforming in a designated range or more in the second direction (−Z axis direction).

The first surface 451 of the rib 450 may be disposed to face at least a portion of the outer surface of the USB module, supporting the USB module. For example, when an external force is applied to the top or bottom of the USB module, the USB module may be prevented from moving in a designated range or more, thereby preventing the USB module from bending or deforming from its initial state. The rib 450 may prevent the soldered connection of the USB module itself or connection of the USB module to the bracket 332 from being broken by an external force. The rib 450 may be positioned in a portion of the bracket 332 and be formed of a non-metallic material.

The side walls 460 may be disposed on both sides (e.g., a third direction (+X direction) and/or a fourth direction (−X axis direction)) of the sealing area 440. The side walls 460 may project at a designated thickness to the inside of the electronic device 101. The side walls 460 may include a first side wall 461 disposed along at least a surrounding of the through-hole 430 and disposed on a right side (e.g., the third direction (+X axis direction)) of the sealing area 440 and a second side wall 462 facing the first side wall 461 and disposed on a left side (e.g., the fourth direction (−X axis direction)) of the sealing area 440. The first side wall 461 and the second side wall 462 may be disposed to project at the same thickness from the sealing area 440. The first side wall 461 and the second side wall 462 may extend from the surrounding bracket 332. The side walls 460 may project at the same thickness as the rib 450 or may project further to the inside of the electronic device than the rib 450.

The inner surfaces of the first side wall 461 and the second side wall 462 may be disposed to face at least a portion of the outer surface of the sealing member, providing a seating area in which the sealing member is stably positioned. The inner surfaces may be disposed to be partially spaced apart from or contact the outer surface facing in the third direction (+X axis direction) and/or fourth direction (−X axis direction) of the sealing member and, when the sealing member is compressed and expanded by, e.g., an external force, prevent deformation in a designated range or more in the third direction (+X axis direction) and/or the fourth direction (−X axis direction).

The first side wall 461 and second side wall 462 may be disposed to face at least a portion of the outer surface of the USB module, supporting the USB module. For example, when an external force is applied to the top or bottom of the USB module, the USB module may be prevented from moving in a designated range or more, thereby preventing the USB module from bending or deforming from its initial state. The rib 450 may prevent the soldered connection of the USB module itself or connection of the USB module to the bracket 332 from being broken by an external force. The side walls 460 may be positioned in a portion of the bracket 332 and be formed of a non-metallic material.

The recess 470 may be disposed in an area of the rib 450. There may be provided at least one recess 470. The recess 470 may be shaped to be concave (dug) towards the outside of the electronic device, as a hole with a thickness corresponding to the designated thickness of the projecting rib 450. For example, the recess 470 may be flush with the sealing area 440 disposed adjacent to the rib 450.

The recess 470 may be disposed adjacent to the through-hole 430 and, when viewed from the rear surface of the bracket 332, a portion of the sealing member disposed in the USB module may be disposed to face the rear plate. For example, with the sealing member inserted inside the bracket 332, at least a portion of the sealing member may be exposed through the recess 470.

The recess 470 may include a first surface 471 facing the outside of the electronic device 101 and flush with the sealing area 440 and a second surface 472 and third surface 473 extending from both sides of the first surface 471, and the recess 470 may be designed in various shapes. In the recess 470, the first surface 471 may extend substantially perpendicular to or at a designated angle from the second surface 472 (or third surface 473). The second surface 472 and/or the third surface 473 may have a surface inclined at a designated angle with respect to the first surface 471. The designated angle may be an obtuse angle with respect to the first surface 471. The recess 470 may be shaped as a rectangle with a side opening or a trapezoid with a side opening, or the recess 470 may have other various structures. The second surface 472 and/or the third surface 473 may be formed as a curved surface.

The recess 470 may indirectly control the positioning of the USB module disposed in the bracket 332, thereby enhancing the sealability of the sealing structure 400. For example, position information may be obtained through the recess 470. The seating space 410 of the coupling part 420 and the USB module may be processed using the obtained information, so that the USB module may be positioned stably. Since the positioning of coupling the USB module and the seating space 410 is adjusted depending on a predetermined distance spaced apart from the sealing area 440, it may be influenced from the recess 470 which is flush with the sealing area 440.

Figure 6A:
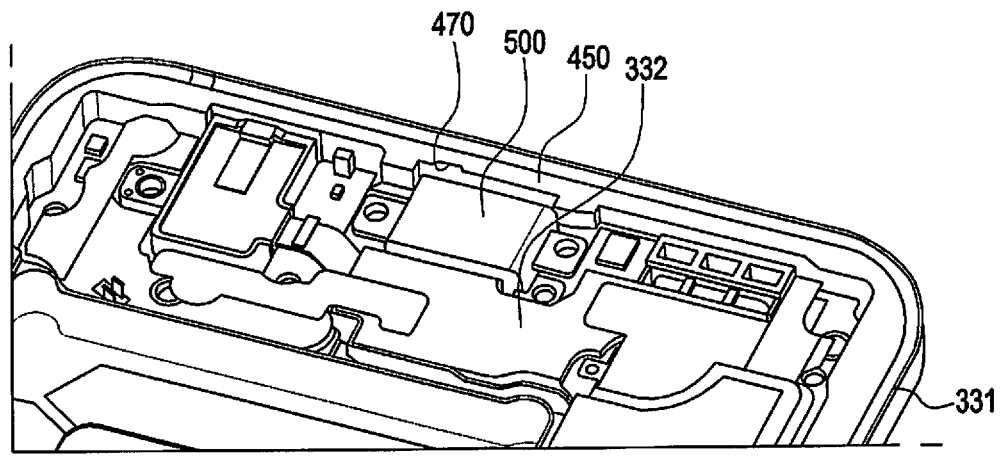
FIGS. 6A and 6B illustrate a portion of a housing with a USB module mounted therein according to an embodiment.
Figure 6B:
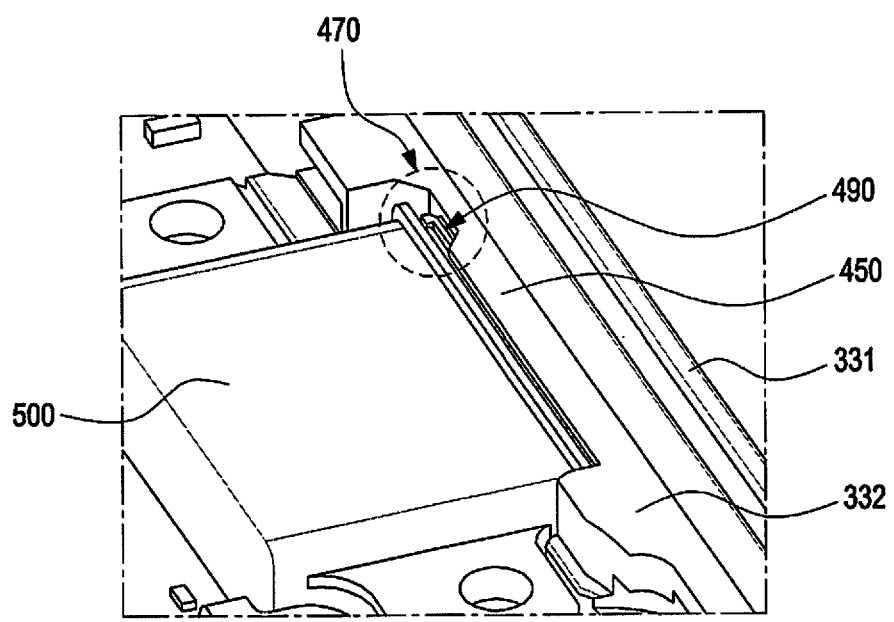

FIGS. 6A and 6B illustrate a portion of a housing with a USB module mounted therein according to an embodiment.

Figure 7A:
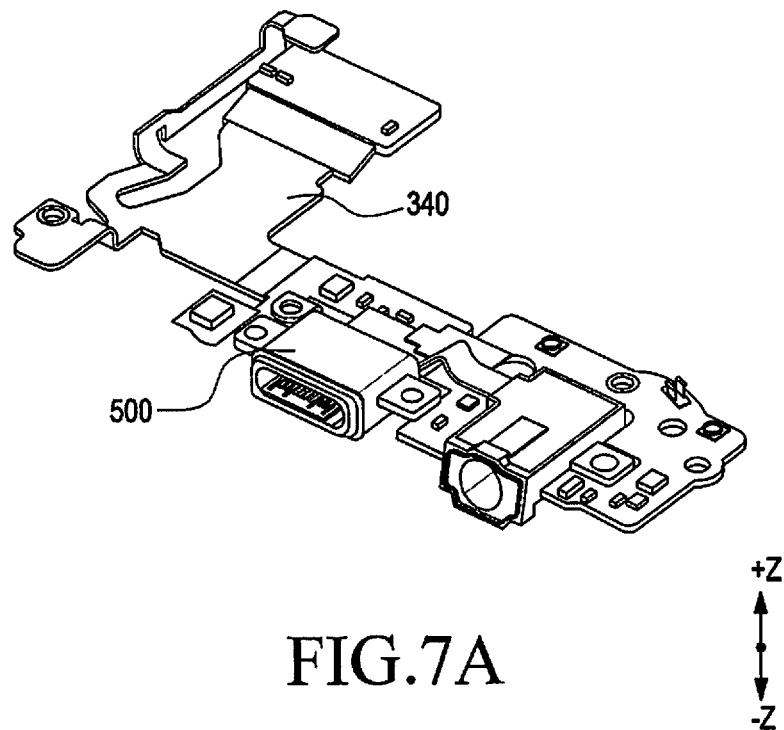
FIG. 7A illustrates a USB module connected to a printed circuit board according to an embodiment.
Figure 7B:
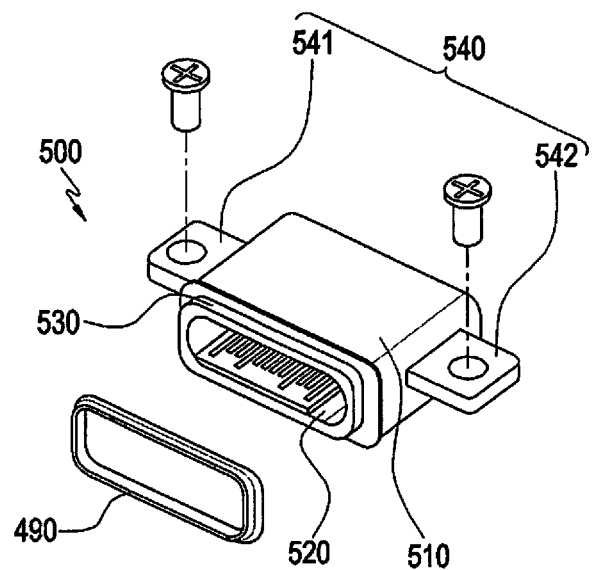
FIG. 7B illustrates a USB module according to an embodiment.

FIG. 7A illustrates a USB module connected to a printed circuit board according to an embodiment, and FIG. 7B illustrates a USB module according to an embodiment.

Referring to FIGS. 6A, 6B, 7A, and 7B, an electronic device includes a housing, which includes a side bezel structure 331 and a bracket 332. The side bezel structure 331 and the bracket 332 may be integrally formed with each other. The side bezel structure 331 and bracket 332 of FIGS. 6A, 6B, 7A, and 7B may be identical in whole or part to the side bezel structure 331 and first supporting member 332 of FIG. 3.

The bracket 332 provides a space for receiving a plurality of electronic components. The side bezel structure 331 may be formed to surround at least a portion of the bracket 332, covering a side surface of the electronic device.

A sealing structure may be provided in an area inside the bracket 332 to seat at least one electronic component and prevent a foreign body from entry into the inside of the electronic device. For example, the electronic component may be a USB module 500 capable of wiredly or wirelessly transmitting/receiving power or data to/from the outside of the electronic device. According to an embodiment, the sealing structure 400 may include a seating space in which the USB module 500 sits, a coupling part for fastening the USB module 500 to the bracket 332, at least one through-hole for allowing the USB module 500 to communicate with the outside, and a sealing member 490 and sealing area for sealing the USB module 500 and the outside. The sealing area may include a rib for stably supporting the USB module 500 and enhancing the sealability and at least one recess 470 disposed on the same line as the rib. The sealing structure of FIGS. 6, 6B, 7A, and 7B may be identical in whole or part to the sealing structure 400 of FIGS. 4 to 5B.

The USB module 500 may be disposed on, and electrically connected with, a printed circuit board 340. For example, a portion of the USB module 500 which faces in the first direction (+Z axis direction) may be at least partially inserted into the seating space, and another portion of the USB module 500 which faces in the second direction (-Z axis direction) opposite to the first direction (+Z axis direction) may be disposed to face the printed circuit board 340. When viewed from the rear surface of the bracket 332 (e.g., as in FIG. 6B), at least a portion of the sealing member 490 may be disposed to be exposed through the recess 470. For example, the surface which faces the rear surface of the sealing member 490 may be mostly covered by the rib and thus not exposed towards the rear surface. However, the portion disposed adjacent to the recess 470 may be exposed to face the rear plate by the shape of the recess 470 which is opened towards the rear surface.

The USB module 500 includes a main body 510, a hole connector 520 opened towards the inside of the main body 510, a sealing portion 530 disposed along a surrounding of the hole connector 520, and a coupling portion 540 coupled with the coupling part 420 to fasten the USB module 500. The main body 510 may include an array of a plurality of pins and a contact connected with the printed circuit board 340. The hole connector 520 may provide a path that communicates with the through-hole 430 and is connected with the plug connector of the external device. The hole connector 520 may be exposed to the outside of the electronic device through the through-hole 430.

The sealing member 490 may be positioned between the USB module 500 and the housing, sealing the space between the USB module 500 and the housing. The sealing member 490 may be formed in a closed loop shape to correspond to the shape of the sealing portion 530. The sealing member 490 may include substantially four surfaces. The sealing portion 530 may be disposed to be exposed towards the through-hole from the main body 510, and an inside surface of the sealing member 490 may be fitted into the area where the sealing member 490 is seated. If the sealing member 490 and the seated USB module 500 are assembled in the bracket 332, a foreign body, such as a fluid/moisture, may be prevented from entry into the inside of the electronic device through the surroundings of the through-hole. However, the sealing member 490 and the sealing portion 530 are not limited to those shapes but may rather be formed in other various shapes that may block a foreign body. The sealing member 490 may be formed of a water-resistant or water-proof material, e.g., an elastic material, rubber, silicone, or synthetic resin.

The coupling portion 540 may extend from the main body 510 and project in a direction perpendicular to the first direction (+Z axis direction) and/or second direction (-Z axis direction), coupling with the coupling part of the sealing structure. There may be provided a plurality of coupling portions 540 to be able to compress and support the sealing member 490 to the sealing area. The coupling portions 540 include a first coupling portion 541 and a second coupling portion 542 disposed on both sides of the main body 510. For example, the first coupling portion 541 and the second coupling portion 542 may have holes corresponding to the holes of the coupling parts for guiding fastening via couplers, e.g., screws. The coupling portion 540 may have an attaching material, e.g., a tape or adhesive, placed between it and the coupling part, thereby guiding attachment and fastening. For the area in which the coupling part and the coupling portion 540 are coupled together, a precise position needs to be set to prevent movement of the USB module 500 and entry of a foreign body into the inside of the electronic device upon manufacture.

Figure 8:
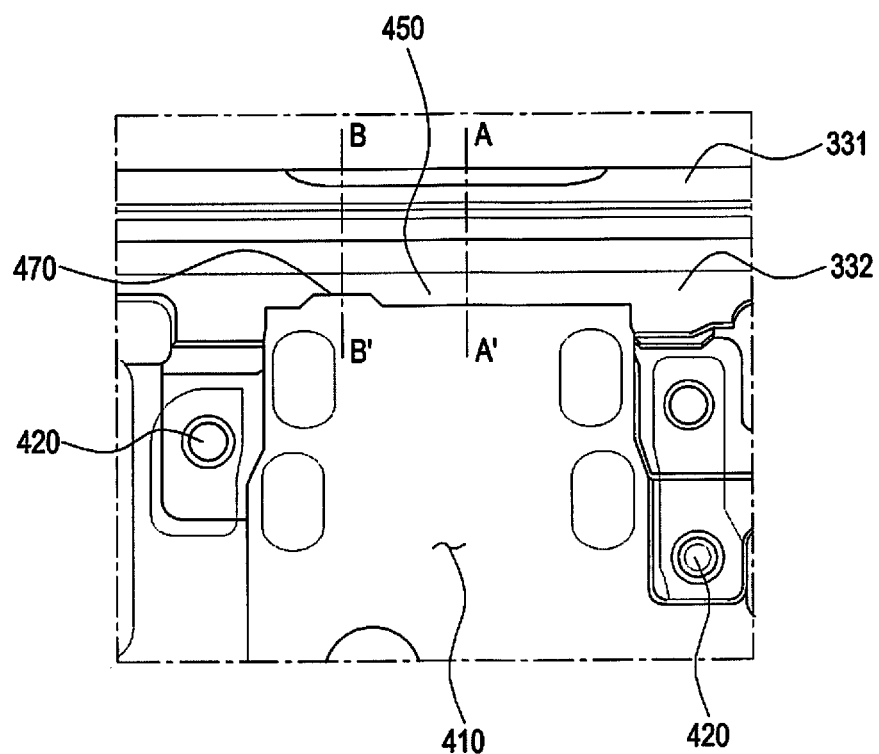
FIG. 8 illustrates an area of a sealing structure according to an embodiment.

FIG. 8 illustrates an area of a sealing structure according to an embodiment.

Figure 9A:
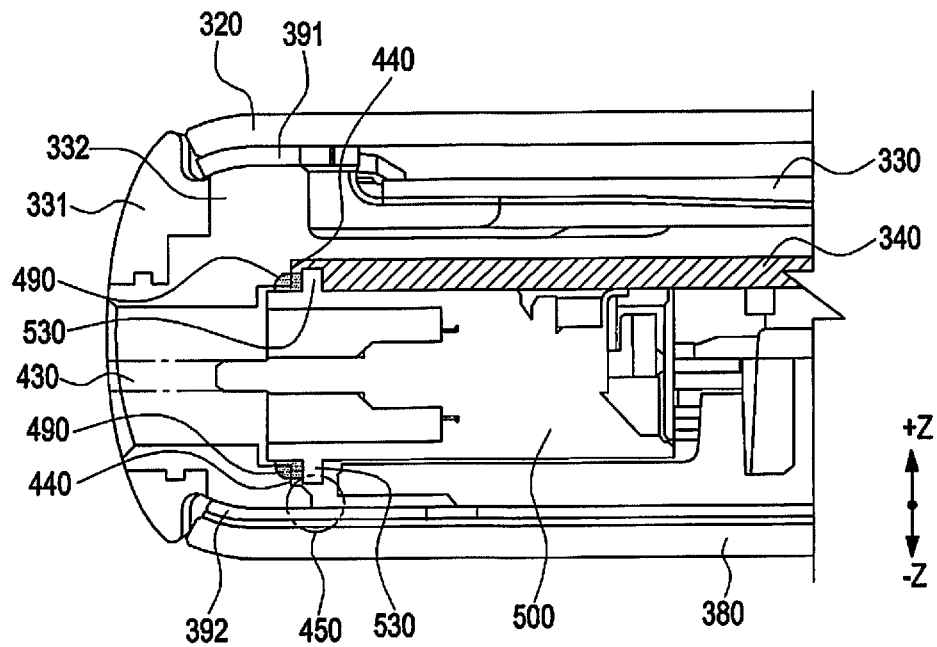
FIG. 9A illustrates a cross-sectional view taken along line A-A' from the sealing structure of FIG. 8 according to an embodiment.
Figure 9B:
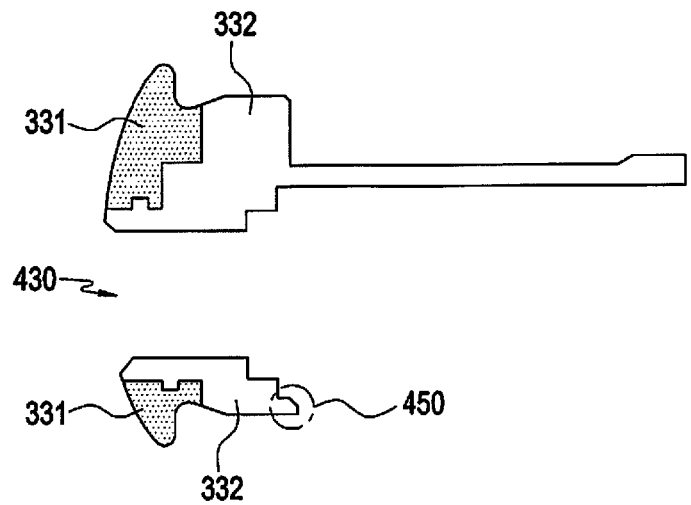
FIG. 9B illustrates a cross-sectional view illustrating the shape of the bracket and the side bezel structure of FIG. 9A according to an embodiment.
Figure 10A:
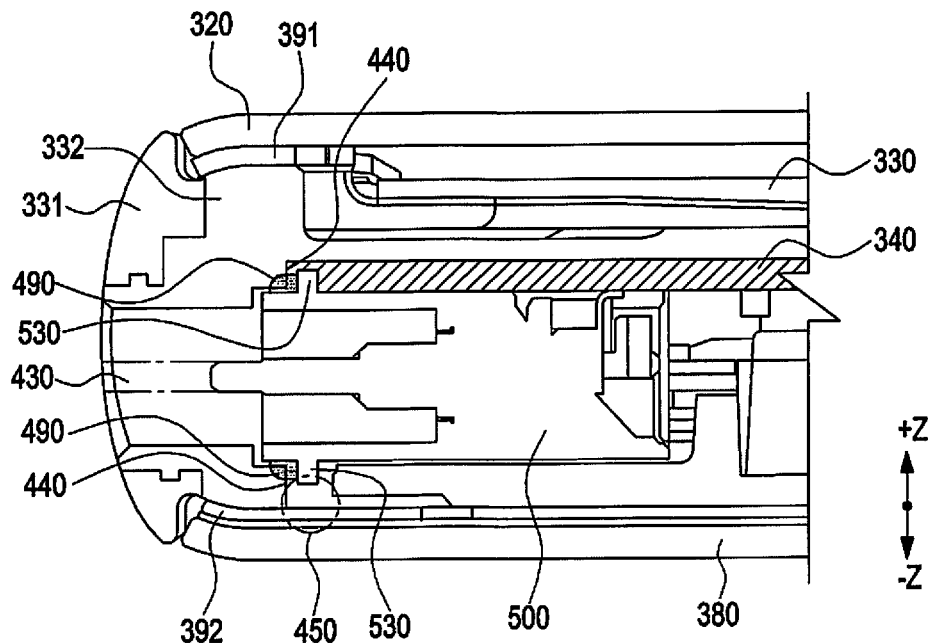
FIG. 10A illustrates a cross-sectional view taken along line B-B' from the sealing structure of FIG. 8 according to an embodiment.
Figure 10B:
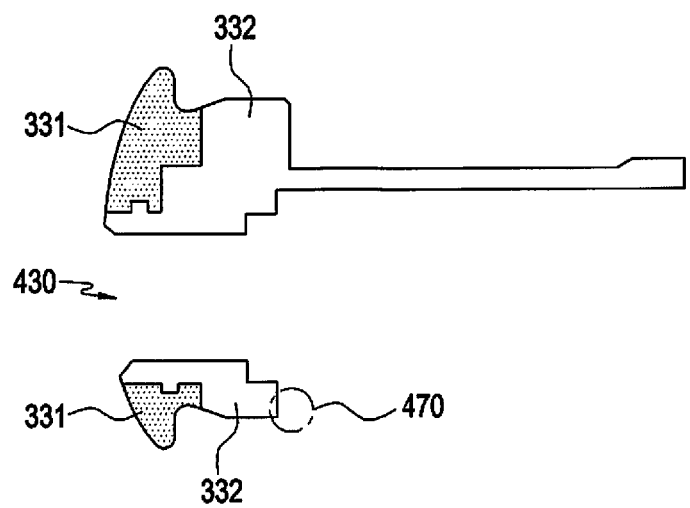
FIG. 10B illustrates a cross-sectional view illustrating the shape of the bracket and the side bezel structure of FIG. 10A according to an embodiment.

FIG. 9A illustrates a cross-sectional view taken along line A-A' from the sealing structure of FIG. 8 according to an embodiment; and FIG. 9B illustrates a cross-sectional view illustrating the shape of the bracket and the side bezel structure of FIG. 9A according to an embodiment. FIG. 10A illustrates a cross-sectional view taken along line B-B' from the sealing structure of FIG. 8 according to an embodiment; and FIG. 10B is a cross-sectional view illustrating the shape of the bracket and the side bezel structure of FIG. 10A according to an embodiment.

Referring to FIGS. 8, 9A, 9B, 10A, and 10B, an electronic device may include a housing (e.g., the side bezel structure 331 and the bracket 332), a front plate 320, a display 330, a printed circuit board 340, and a sealing structure. The housing, the front plate 320, the display 330, and the printed circuit board 340 of FIGS. 8, 9A, 9B, 10A, and 10B may be wholly or partially identical in structure to the side bezel structure 331, the first supporting member 332, the front plate 320, the display 330, and the printed circuit board 340 of FIG. 3. The sealing structure of FIGS. 8, 9A, 9B, 10A, and 10B may be identical in whole or part to the sealing structure 400 of FIG. 5.

The housing may include the side bezel structure 331 and the bracket 332. The side bezel structure 331 and the bracket 332 may be integrally formed with each other. The side bezel structure 331 may be formed of a conductive material, such as a metal, e.g., at least one of aluminum, magnesium, or stainless steel (SUS). The bracket 332 may be disposed inside the side bezel structure 331 and be formed of a non-conductive material.

The sealing structure may include a seating space 410 in which the USB module 500 sits, a coupling part 420 for fastening the USB module 500 to the bracket 332, at least one through-hole 430 for allowing the USB module 500 to communicate with the outside, and a sealing area 440 in which a sealing member 490 is positioned to seal the USB module 500 off from the outside. The sealing structure may include a rib 450 for enhancing the sealability and at least one recess 470 disposed on the same line as the rib 450.

Referring to FIGS. 9A and 10A, in a portion of the electronic device, the display 330, the printed circuit board 340, the USB module 500, and the rear plate 380 may sequentially be arranged in the second direction (−Z axis direction) which is opposite to the first direction (+Z axis direction) with respect to the front plate 320 disposed to face in the first direction (+Z axis direction).

A first attaching member 391 may be disposed between the front plate 320 and the housing 310, attaching the front plate 320 to one surface of the housing 310. For example, an edge area of the front plate 320 may be disposed to contact one surface of the side bezel structure 331 and bracket 332 exposed in the first direction (+Z axis direction). A second attaching member 392 may be disposed between the rear plate 380 and the housing 310, attaching the rear plate 380 to another surface of the housing 310. For example, an edge area of the rear plate 380 may be disposed to contact one surface of the side bezel structure 331 and bracket 332 exposed in the second direction (−Z axis direction). The first attaching member 391 and the second attaching member 392 may be formed of a waterproof material to block entry of a foreign body from the outside.

The sealing member 490 may be disposed between the sealing portion 530 of the USB module 500 and the sealing area 440, sealing off the space which is oriented towards the inside of the electronic device 101. For example, an upper portion of the sealing member 490 may provide an area that overlaps the top of the sealing portion 530 of the USB module 500 and the top of the sealing area 440. Alternatively, a lower portion of the sealing member 490 may provide an area that overlaps the bottom of the sealing portion 530 of the USB module 500 and the bottom of the sealing area 440.

Referring to FIG. 9A, the rib 450 of the sealing structure may project to the inside of the electronic device.

Referring to FIG. 10A, the recess 470 of the sealing structure may be disposed on the same line as the rib 450, shaped to have a side opening, and flush with the sealing area 440.

Figure 11A:
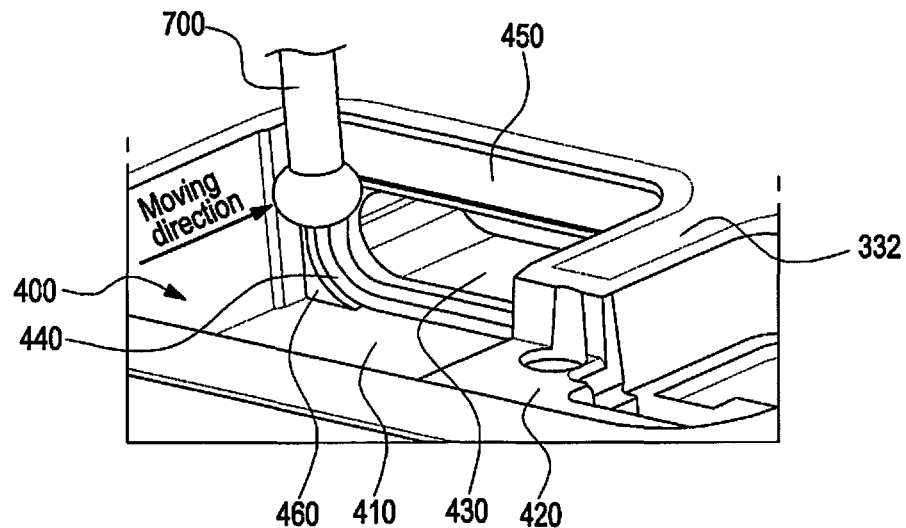
FIGS. 11A, 11B, and 11C illustrate a process of measurement by a probe according to an embodiment.
Figure 11B:
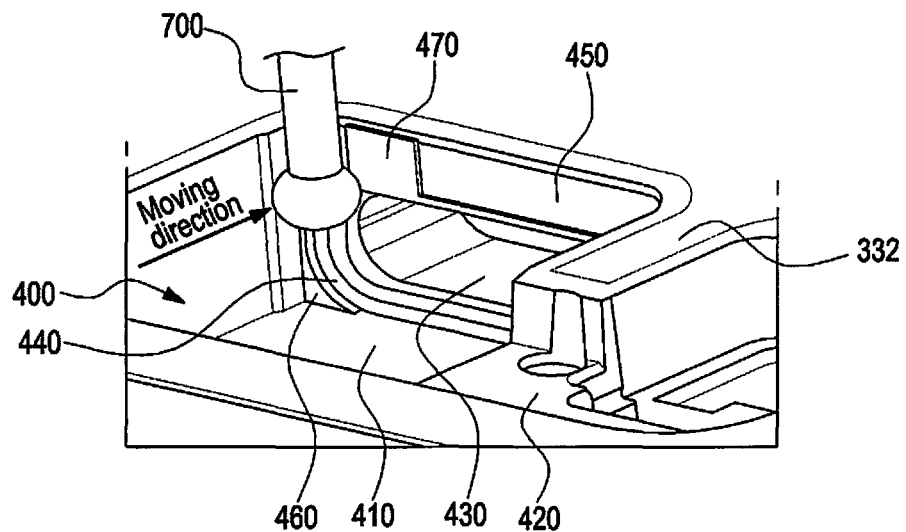
Figure 11C:
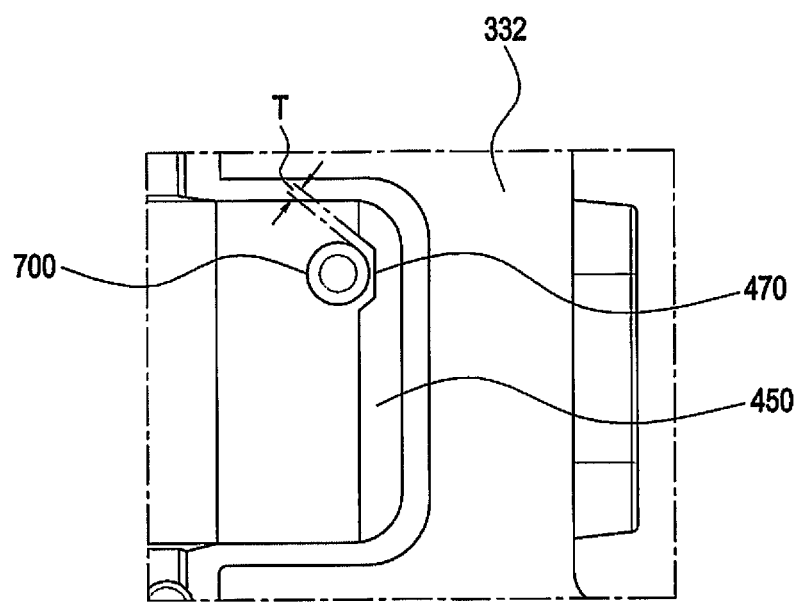
Figure 12:
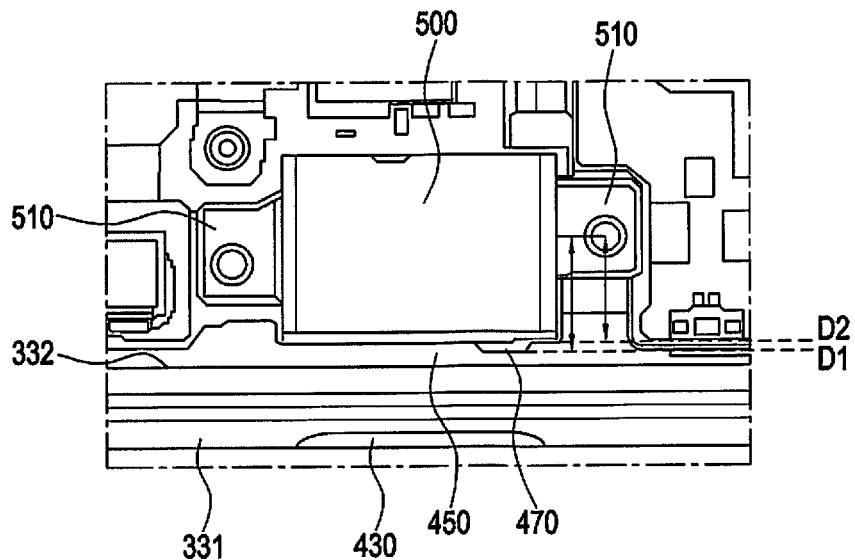
FIG. 12 illustrates a position of a USB module according to an embodiment.
Figure 13:
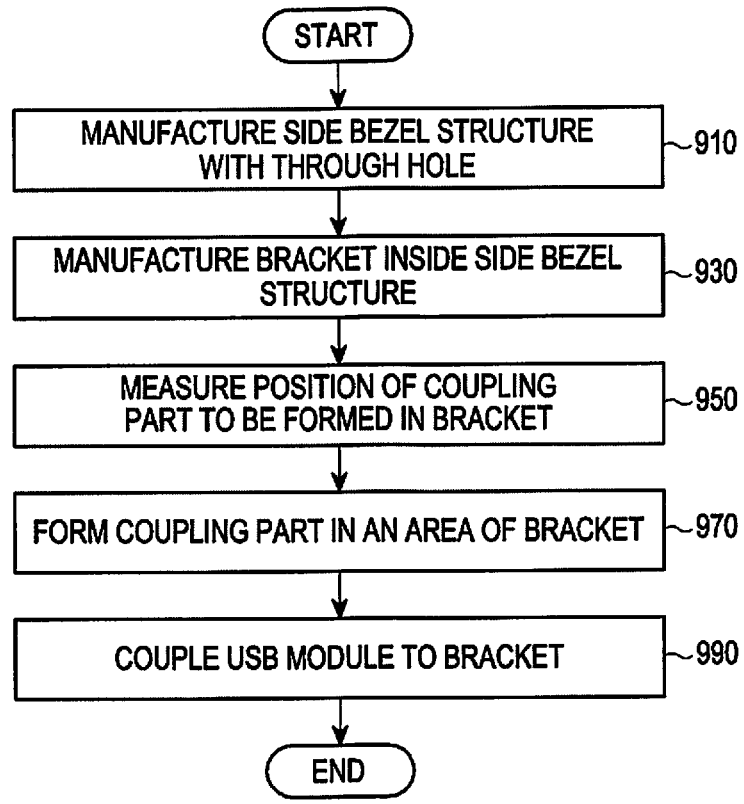
FIG. 13 is a flowchart illustrating a process of assembling a sealing structure according to an embodiment.

FIGS. 11A, 11B, and 11C illustrate a process of measurement by a probe according to an embodiment. FIG. 12 illustrates a position of a USB module according to an embodiment. FIG. 13 is a flowchart illustrating a process of assembling a sealing structure according to an embodiment.

More specifically, FIGS. 11A to 11C illustrate a sealing structure 400 in which no electronic component (e.g., a USB module) is mounted. The sealing structure 400 may include a seating space 410 in which the USB module sits, a coupling part 420 for fastening the USB module to the bracket 332, at least one through-hole 430 for allowing the USB module to communicate with the outside, a rib 450, a recess 470 (which is provided only in FIG. 11B), and a sealing area 440 for sealing the USB module from the outside. The sealing structure 400 of FIGS. 11A to 11C may be identical in whole or part to the sealing structure 400 of FIGS. 4A to 7B.

Referring to FIG. 13, to form the sealing structure 400, the side bezel structure 331 may first be formed of a metal. The side bezel structure 331 may form the outside and inside structures of the electronic device by computer numerical control (CNC) processing, and a through-hole for connecting the USB module with an external device may be formed in step 910.

After forming the side bezel structure 331 including the through-hole 430, a bracket 332 may be formed inside the side bezel structure 331 by insert molding. The bracket 332 may implement a space in which the USB module 500 is seated and a through-hole extending from the through-hole of the side bezel structure 331. The bracket 332 may implement a sealing structure including a rib 450, a recess 470 on the rib 450, and side walls 460 in step 930.

To provide stable waterproofing to the sealing structure in which the USB module 500 is seated after forming the bracket 332, a position for fastening the USB module 500 and/or a position for the sealing member 490 disposed in the USB module 500 may be set in step 950.

After the position is set, a process for forming a coupling part for fastening the USB module may be performed in step 970.

The positioning may be performed by a microscope measure system (MMS) machine. For example, the positioning may be performed as the MMS machine measures the distance from a designated reference point to one point in the sealing area 440 by a probe 700. After a relative position between the reference point and the sealing area is determined in the bracket 332, a coupling position (e.g., the coupling part 420) of the USB module 500 to be seated in the bracket may be determined and processed. The coupling part 420 may be shaped as a hole and be coupled with the coupling portion 540 of the USB module 500. The hole-shaped coupling part 420 may be formed by adjusting the distance spaced apart from the sealing area 440 measured by the probe 700. As compared with FIG. 11A, in the sealing structure with the recess 470 of FIGS. 11B and 11C, the distances to the coupling portion 540 and the sealing area 440 may precisely be measured, and the coupling part 420 may be formed in the position where the sealing effect may be maximized.

Referring to FIG. 11A, in a sealing structure in which no recess is formed, the probe 700 may approach from the top of the bracket 332, measuring the distances to the reference point and the measured point. As a designated size is considered for the probe 700, approach of the probe 700 to the sealing area 440 positioned inside the rib 450 may be limited, and precise measurement from the reference point to the sealing area 440 may be impossible. For example, the space where the probe 700 may approach may be restricted by the rib 450 projecting at a designated thickness to the inside of the housing beyond the sealing area 440. The probe 700 may not approach the sealing area 440, and the distance from the reference point to the rib 450 is measured. Thus, the bracket 332 is manufactured which considers only the distance between the rib 450 and the coupling portion 540 for fastening the USB module 500, so that the USB module 500 may be mounted in a position with an error range. The effects of the sealing structure 400 by the USB module 500 disposed within the error range may be identified by a waterproof test only after assembly is complete. A sealing structure 400 that fails in the waterproof test may not be used as a product, and a waste of time, material, and cost may occur.

Referring to FIGS. 11B and 11C, in the sealing structure with the recess 470, the recess 470 may be shaped as a hole, and at least a portion of the recess 470 may be formed to be flush with the sealing area 440. The hole shape may have an inclined or partially bent corner, allowing the spherical probe 700 to stably approach without interference.

The recess 470 may be designed to have a designated size in which the probe 700 may approach. The recess 470 may be designed to have as large a room as a designated gap from the periphery of the probe 700 to allow the probe 700 to easily contact and measure the position. For example, the recess 470 may have both side surfaces inclined corresponding to the shape (e.g., a sphere) of the probe 700. As viewed from the top (e.g., the rear surface) of the bracket 332, the inclined surface and the tangent line parallel with the inclined surface may be spaced apart from each other in a designated distance T. The probe 700 may approach from the top of the bracket 332, measuring the distances to the reference point and the measured point.

The probe 700 may approach the sealing area 440 positioned inside the rib 450 and/or the inside of the recess 470 flush with the sealing area 440, precisely measuring the distance from the reference point to the inside of the recess 470. For example, the recess 470 and the sealing area 440 may be substantially flush with each other. The distance from the reference point to the recess 470 is identical to the distance from the reference point to the sealing area 440. Thus, the distance between the sealing area 440 and the coupling portion 540 for fastening the USB module 500 may be precisely measured, and the bracket 332 may be manufactured considering the distance. If the USB module 500 is mounted in the bracket 332, an enhanced waterproof structure may be implemented, as compared with the structure of FIG. 4A. Defects in a future waterproof test may be minimized, saving material, time, and costs.

Referring again to FIG. 13, after the coupling part 420 is formed in the bracket 332, the USB module 500 may be assembled in the bracket 332 in step 990. For example, the USB module 500 with the sealing member 490 may be disposed in the seating space 410, and the coupling portion 540 of the USB module 500 may be coupled with the coupling part 420, providing fastening. A plurality of coupling portions 540 corresponding to the coupling parts 420 may be provided to compress and support the sealing member 490 to the sealing area 440. For example, the coupling portion 540 may have a hole corresponding to the hole of the coupling part 420 for guiding fastening via a coupler, e.g., screw.

The distance from a virtual first line D1 extending in the lengthwise direction from the recess 470 to the center of the hole of the coupling part 420 may be measured to be larger than the distance from a virtual second line D2 extending in the lengthwise direction from the rib 450 to the center of the hole of the coupling part 420. The sealing structure with the recess 470 enables precise distance measurement as long as the distance difference.

FIGS. 14, 15, 16, 17, 18A, and 18B illustrate various positions of a recess in a sealing structure according to an embodiment.

Referring to FIGS. 14, 15, 16, 17, 18A, and 18B, the sealing structure 400 includes a seating space 410 in which a USB module sits, a coupling part 420 for fastening the USB module to the bracket 332, at least one through-hole 430 for allowing the USB module to communicate with the outside, and a sealing area 440 for sealing the USB module off from the outside of the electronic device. The sealing area 440 may include a rib 450 for enhancing the sealability and at least one recess 470 disposed on the same line as the rib 450. The sealing structure 400 of FIGS. 14 to 18B may be identical in whole or part to the sealing structure 400 of FIG. 5.

The rib 450 may be disposed to face at least a portion of the seating space 410, with the through-hole 430 disposed therebetween, and both ends of the rib 450 may be connected with the side walls. The recess 470 may be disposed on the rib 450. The recess 470 may be formed in various positions and in various shapes for the probe 700 to easily approach. One side of the recess 470 may be spaced a first distance L1 apart from one end of the rib 450 (e.g., a contact area to the rib 450 and the first side wall 461), and another (e.g., opposite) side of the recess 470 may be spaced a second distance L2 apart from another (e.g., opposite) end of the rib 450 (e.g., a contact area to the rib 450 and the second side wall 462).

Figure 14:
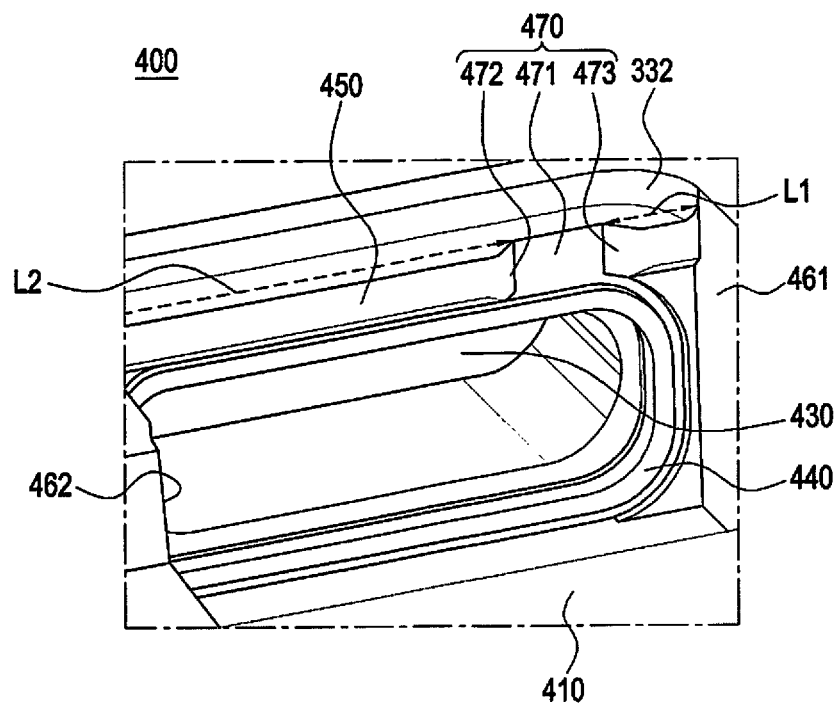
FIGS. 14, 15, 16, 17, 18A, and 18B illustrate various positions of a recess in a sealing structure according to an embodiment.

Referring to FIG. 14, the recess 470 may be formed in a right area of the rib 450. For example, the recess 470 may be positioned close to the one end of the rib 450 and away from the other end of the rib 450. As an example, the first distance L1 may be shorter than the second distance L2. However, without limitations thereto, the recess 470 may be formed in a left area of the rib 450.

The recess 470 includes a first surface 471 flush with the sealing area 440 and a second surface 472 and third surface 473 extending from both sides of the first surface 471, and the recess 470 may be designed in various shapes. In the recess 470, the first surface 471 may extend perpendicular to or at a designated angle from the second surface 472 (or third surface 473). The second surface 472 and/or the third surface 473 may be formed with a curved surface or a surface inclined at a designated angle from the first surface 471. The length of the first surface 471 may be identical to the first length L1 or may be larger than the first length L1 and smaller than the second length L2.

Figure 15:
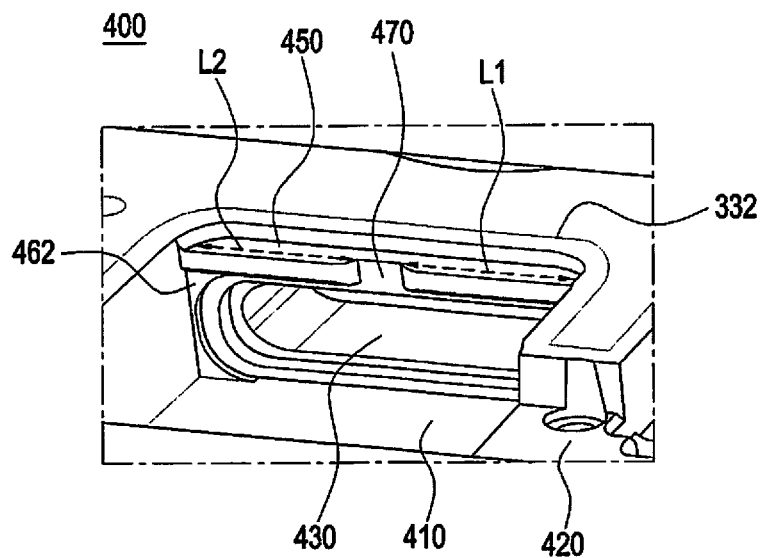

Referring to FIG. 15, the recess 470 may be disposed in the center of the rib 450. The recess 470 may be formed so that the first distance L1 is identical to the second distance L2. The length of the first surface flush with the sealing area 440 of the recess 470 may be shorter than the first length L1 and the second length L2.

Figure 16:
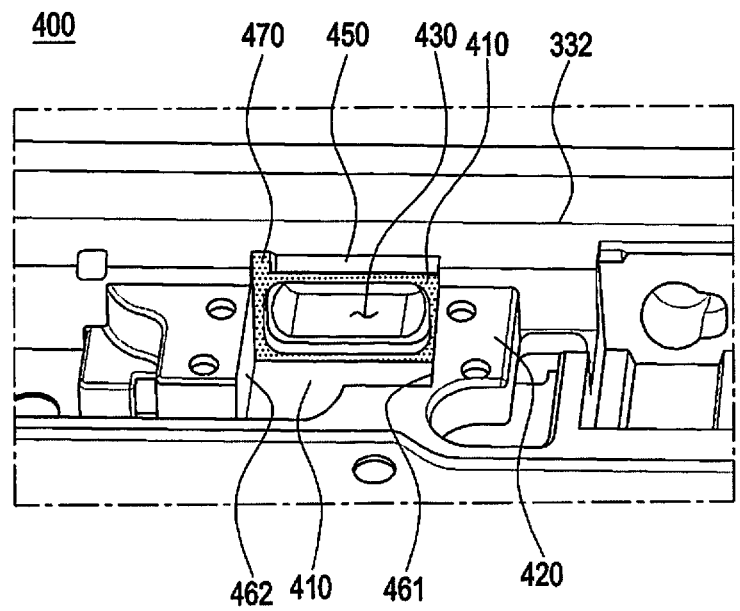

Referring to FIG. 16, the recess 470 may be disposed at an end of the rib 450. The recess 470 may be formed in a position contacting the first side wall 461 or the second side wall 462 so that the first distance or the second distance is not formed.

Figure 17:
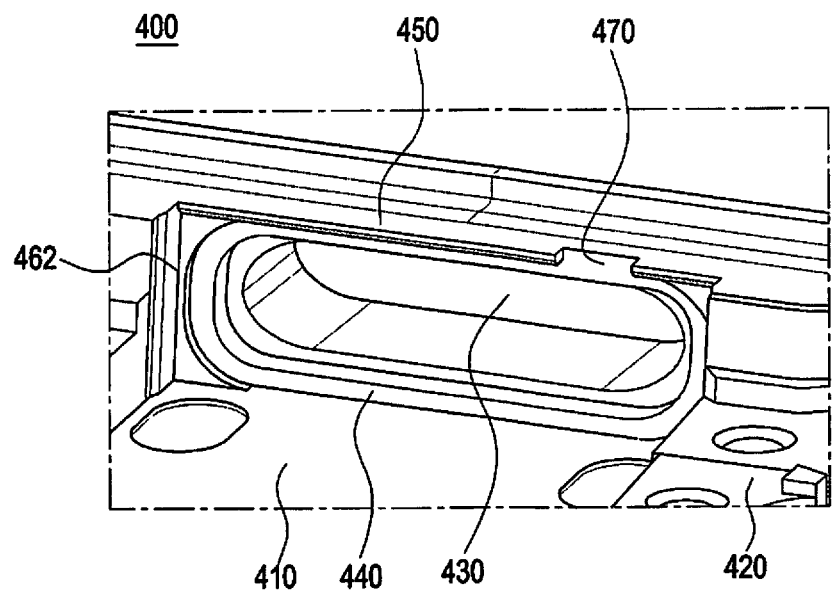
Figure 18A:
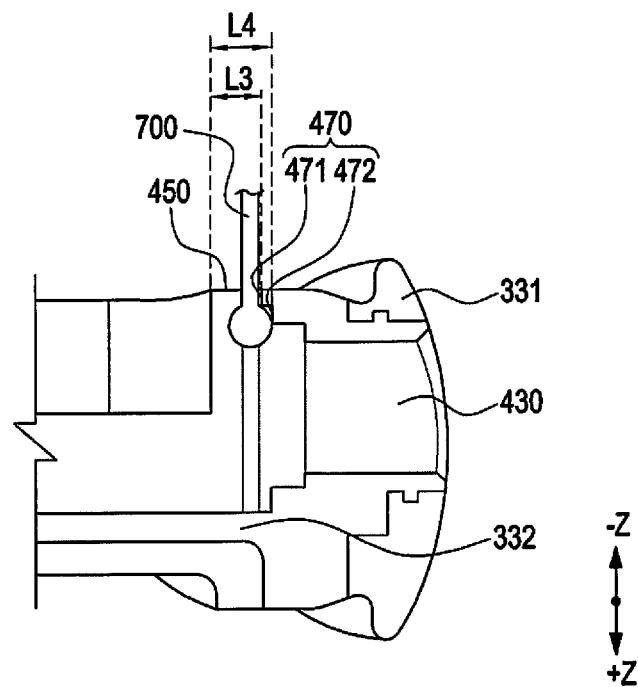
Figure 18B:
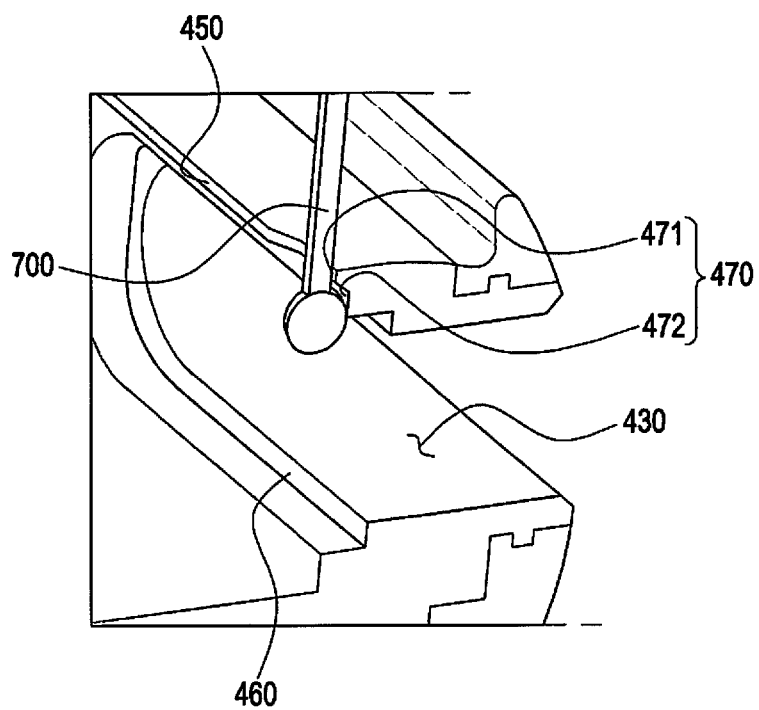

Referring to FIGS. 17 to 18B, the recess 470 may be formed in various positions in the rib 450 and be shaped as a step. The recess 470 may include a first recess 471 concave to the outside of the electronic device 101 and a second recess 472 further concave to the outside of the electronic device 101 than the first recess 471.

The second recess 472 may be stepped from the first recess 471. The first recess 471 may extend from the outer surface of the bracket 332 which faces in the second direction (−Z axis direction). The second recess 472 may be disposed adjacent to the through-hole 430, be an area which the probe 700 substantially contacts, and be flush with the sealing area 440.

The first recess 471 may form a thickness of a third length L3 from an end of the rib 450, and the second recess 472 may form a thickness of a fourth length L4 from an end of the rib 450. The third length L3 may be smaller than the fourth length L4. By the first recess 471, the attaching area of the bracket 332 and the rear plate (e.g., the rear plate 380 of FIG. 10A) may relatively increase. In the stepped recess structure, the first recess 471 increases the area for contacting the rear plate 380 and may thus support the rear plate 380 stably. The second recess 472 may directly contact the probe 700 for measuring position, enabling identification of precise distance measurement.

According to an embodiment, an electronic device includes a PCB (e.g., the printed circuit board 340 of FIG. 3), a housing (e.g., the housing 310 of FIG. 2A) receiving the PCB and including a through-hole (e.g., the through-hole 430 of FIG. 5) connected to an outside, an electronic component (e.g., the USB module 500 of FIG. 6) connected with the PCB and for communicating with the outside via the through-hole, and a sealing member (e.g., the sealing member 490 of FIG. 7B) disposed between a surrounding of the through-hole and the electronic component and shaped as a closed loop. The housing includes a sealing area (e.g., the sealing area 440 of FIG. 5) disposed inside the housing along the surrounding of the through-hole and for contacting the sealing member, a rib (e.g., the rib 450 of FIG. 5) projecting towards an inside of the housing from the sealing member, supporting the electronic component, and limiting movement of the electronic component by an external force, and a recess (e.g., the recess 470 of FIG. 5) formed in an area of the rib, at least a portion of the recess flush with a surface of the sealing area.

The recess may be disposed adjacent to the through-hole. The recess may be concave in a direction opposite to the inside of the housing. The electronic component may be at least one of a USB module, an audio module, a sensor module, a camera module, an antenna module, or a communication module.

The recess may include a first surface (e.g., the first surface 471 of FIG. 5) flush with the sealing area, a second surface (e.g., the second surface 472 of FIG. 5) extending from a side of the first surface and having a surface inclined at a designated angle, and a third surface (e.g., the third surface 473 of FIG. 5) extending from another side of the first surface and having a surface inclined at a designated angle corresponding to the second surface.

The inclined surfaces of the second surface and the third surface may include a curved surface.

The designated angles of the second surface and the third surface may be obtuse angles with respect to the first surface.

The housing may include a bracket (e.g., the bracket 332 of FIG. 3) providing a space for receiving a plurality of electronic components, a side bezel structure (e.g., the side bezel structure 331 of FIG. 3) surrounding at least a portion of the bracket and integrally formed with the bracket, and a rear plate (e.g., the rear plate 380 of FIG. 3) connected with the bracket and the side bezel structure and covering a rear surface of the electronic device. The through-hole may be formed through the bracket and the side bezel structure.

When viewed from a rear surface of the bracket, at least a portion of the sealing member may be exposed through the recess to face the rear plate.

The housing may include a seating space (e.g., the seating space 410 of FIG. 5) disposed adjacent to the through-hole and in which at least a portion of the electronic component is inserted, a coupling part (e.g., the coupling part 420 of FIG. 5) formed around the seating space and for fastening the electronic component seated in the seating space, and side walls (e.g., the side walls 460 of FIG. 5) disposed on both sides of the sealing area and projecting at a predetermined thickness to an inside of the electronic device.

The side walls may project at the same thickness as the rib or further to the inside of the electronic device than the rib. The side walls may support the electronic component and limit movement of the electronic component.

The sealing member may include substantially four side surfaces. The sealing member may be disposed to contact at least a portion of the sealing area to seal a surrounding area of the through-hole from the through-hole and to block a foreign body from entering an inside of the electronic device.

The electronic component may include a main body (e.g., the main body 510 of FIG. 7B), a hole connector 520 having an opening inside the main body, a sealing portion (e.g., the sealing portion 530 of FIG. 7B) disposed along a surrounding of the hole connector, and a coupling portion (e.g., the coupling portion 540 of FIG. 7B) coupled with the coupling part to fasten the electronic component.

The coupling part may include a plurality of hole shapes disposed on both sides of the seating space. A distance from a virtual first line extending from the recess in a lengthwise direction to a center of the hole may be larger than a distance from a virtual second line extending from the rib in a lengthwise direction to the center of the hole.

The rib may be disposed to face at least a portion of the seating space with the through-hole disposed therebetween. Both ends of the rib may connect to the side walls. One side of the recess may be spaced apart from an end of the rib in a first distance, and an opposite side of the recess may be spaced apart from an opposite end of the rib in a second distance. The first distance may differ from the second distance.

The rib may be disposed to face at least a portion of the seating portion with the through-hole disposed therebetween. Both ends of the rib may connect to the side walls. One side of the recess may be spaced apart from an end of the rib in a first distance, and an opposite side of the recess may be spaced apart from an opposite end of the rib in a second distance. The first distance may be identical to the second distance.

The recess may include a first recess (e.g., the first recess 471 of FIG. 18B) formed to be concave from the rib at a first thickness (e.g., the third length L3 of FIG. 18A) and spaced apart from the through-hole and a second recess (e.g., the second recess 472 of FIG. 18B) formed to be concave at a second thickness (e.g., the fourth length L4 of FIG. 18A) larger than the first thickness and stepped from the first recess. The second recess may be flush with the sealing area.

According to an embodiment, an electronic device includes a front plate (e.g., the front plate of FIG. 3) facing in a first direction, a rear plate (e.g., the rear plate 380 of FIG. 3) facing in a second direction opposite to the first direction, a PCB (e.g., the printed circuit board 340 of FIG. 3), a sealing structure (e.g., the sealing structure 400 of FIG. 5) disposed between the front plate and the rear plate and including a through-hole (e.g., the through-hole 430 of FIG. 5) for connecting with an outside, an electronic component (e.g., the USB module 500 of FIG. 6) connected with the PCB and for communicating with the outside through the through-hole, and a sealing member (e.g., the sealing member 490 of FIG. 7B) disposed between a surrounding of the through-hole and the electronic component and shaped as a closed loop. The sealing structure may include a seating space (e.g., the seating space 410 of FIG. 5) for seating the electronic component, a coupling part (e.g., the coupling part 420 of FIG. 5) for fastening the electronic component to the seating space, a sealing area (e.g., the sealing area 440 of FIG. 5) disposed along the surrounding of the through-hole and for sealing the electronic component from an outside of the electronic component, a rib (e.g., the rib 450 of FIG. 5) disposed on a side of the sealing area and projecting further than the sealing area, and at least one recess (e.g., the recess 470 of FIG. 5) disposed on the same line as at least a portion of the rib.

At least a portion of the recess may be flush with the surface of the sealing area.

The sealing structure may further include side walls disposed on both sides of the sealing area and projecting at a designated thickness to an inside of the electronic device.

The recess may include a first surface disposed adjacent to the through-hole and flush with the sealing area and a second and third surface extending from both sides of the first surface. The second surface and the third surface may be disposed to face in a direction different from the first surface.

The rib may include a first surface facing in the first direction and a second surface facing in the second direction. The second surface may provide an area for substantially supporting and attaching an edge of the rear plate. The first surface may provide a seating area disposed to face at least a portion of an outer surface of the sealing member.

As is apparent from the foregoing description, an electronic device according to an embodiment may provide a sealing structure with waterproof functionality.

In the electronic device, the distance between the sealing area and the coupling portion for fastening the electronic component (e.g., a USB module) may be measured and the housing may be manufactured considering the measured distance. Thus, a waterproof/dustproof structure is provided that caps the periphery of the electronic component (e.g., a USB module).

In the electronic device, the sealing structure may be measured before the electronic component (e.g., a USB module) is assembled. Thus, it is also possible to reduce any defects or errors that may arise after assembly and save material, time, and costs.

It is apparent to one of ordinary skill in the art that the electronic device and injection-molded structure constituting the same according to various embodiments of the disclosure as described above are not limited to the above-described embodiments and those shown in the drawings, and various changes, modifications, or alterations may be made thereto without departing from the scope of the disclosure.

While the disclosure has been particularly shown and described with reference to certain embodiments thereof, it will be understood by those of ordinary skill in the art that various changes in form and details may be made therein without departing from the spirit and scope of the disclosure as defined by the following claims and their equivalents

What is claimed is:

1. An electronic device, comprising:
    a printed circuit board (PCB);
    a housing receiving the PCB and including a through-hole connected to an outside of the electronic device;
    an electronic component connected with the PCB and accessible from the outside via the through-hole; and
    a sealing member disposed between a surrounding of the through-hole and the electronic component and shaped as a closed loop,
    wherein the housing includes:
        a sealing area disposed inside the housing, along the surrounding of the through-hole, and for contacting the sealing member,
        a rib projecting towards an inside of the housing from an end of the sealing member, supporting the electronic component, and limiting movement of the electronic component by an external force, and
        a recess formed in an area of the rib, wherein at least a portion of the recess is flush with a surface of the sealing area.

2. The electronic device of claim 1, wherein the recess is disposed adjacent to the through-hole, wherein the recess is concave in a direction opposite to the inside of the housing, and wherein the electronic component includes at least one of a universal serial bus (USB) module, an audio module, a sensor module, a camera module, an antenna module, or a communication module.

3. The electronic device of claim 2, wherein the recess includes:
    a first recess formed to be concave from the rib at a first thickness and spaced apart from the through-hole, and
    a second recess formed to be concave at a second thickness larger than the first thickness and stepped from the first recess, and
    wherein the second recess is flush with the sealing area.

4. The electronic device of claim 1, wherein the recess includes:
    a first surface that is flush with the sealing area,
    a second surface extending from a side of the first surface and being inclined at a first designated angle, and
    a third surface extending from another side of the first surface and being inclined at a second designated angle corresponding to the second surface.

5. The electronic device of claim 4, wherein the inclined surfaces of the second surface and the third surface include a curved surface.

6. The electronic device of claim 4, wherein the first and second designated angles of the second surface and the third surface, respectively, are obtuse angles with respect to the first surface.

7. The electronic device of claim 1, wherein the housing further includes:
    a bracket providing a space for receiving a plurality of electronic components,
    a side bezel structure surrounding at least a portion of the bracket and integrally formed with the bracket, and
    a rear plate connected with the bracket and the side bezel structure and covering a rear surface of the electronic device, and
    wherein the through-hole is formed through the bracket and the side bezel structure.

8. The electronic device of claim 7, wherein at least a portion of the sealing member is exposed through the recess to face the rear plate.

9. The electronic device of claim 1, wherein the housing further includes:
    a seating space disposed adjacent to the through-hole and in which at least a portion of the electronic component is inserted,
    a coupling part formed around the seating space and for fastening the electronic component seated in the seating space, and
    side walls disposed on both sides of the sealing area and projecting at a predetermined thickness to an inside of the electronic device.

10. The electronic device of claim 9, wherein the side walls project at a same thickness as the rib or further to the inside of the electronic device than the rib, and
    wherein the side walls support the electronic component and limit movement of the electronic component.

11. The electronic device of claim 9, wherein the electronic component includes:
    a main body,
    a hole connector having an opening inside the main body,
    a sealing portion disposed along a surrounding of the hole connector, and
    a coupling portion coupled with the coupling part to fasten the electronic component.

12. The electronic device of claim 9, wherein the coupling part includes a plurality of hole shapes disposed on both sides of the seating space, and wherein a distance from a virtual first line extending from the recess in a lengthwise direction to a center of the hole is larger than a distance from a virtual second line extending from the rib in a lengthwise direction to the center of the hole.

13. The electronic device of claim 9, wherein the rib is disposed to face at least a portion of the seating space, with the through-hole disposed therebetween, wherein both ends of the rib are connected with the side walls, wherein one side of the recess is spaced apart from an end of the rib in a first distance, and an opposite side of the recess is spaced apart from an opposite end of the rib in a second distance, and wherein the first distance differs from the second distance.

14. The electronic device of claim 9, wherein the rib is disposed to face at least a portion of the seating space, with the through-hole disposed therebetween, wherein both ends of the rib are connected with the side walls, wherein one side of the recess is spaced apart from an end of the rib in a first distance, and an opposite side of the recess is spaced apart from an opposite end of the rib in a second distance, and wherein the first distance is identical to the second distance.

15. The electronic device of claim 1, wherein the sealing member includes substantially four side surfaces, and wherein the sealing member is disposed to contact at least a portion of the sealing area to seal a surrounding area of the through-hole from the through-hole and to block a foreign body from entering an inside of the electronic device.

16. An electronic device, comprising:

a front plate facing in a first direction;

a rear plate facing in a second direction opposite to the first direction;

a printed circuit board (PCB);

a sealing structure disposed between the front plate and the rear plate and including a through-hole for connecting with an outside of the electronic device;

an electronic component connected with the PCB and accessible from the outside through the through-hole; and a sealing member disposed between a surrounding of the through-hole and the electronic component and shaped as a closed loop, wherein the sealing structure includes:

a seating space for seating the electronic component, a coupling part for fastening the electronic component to the seating space, a sealing area disposed along the surrounding of the through-hole and for sealing the electronic component from an outside of the electronic component, a rib disposed on a side of the sealing area and projecting further than the sealing area, and at least one recess disposed on the same line as at least a portion of the rib.

17. The electronic device of claim 16, wherein at least a portion of the recess is flush with a surface of the sealing area.

18. The electronic device of claim 17, wherein the sealing structure further includes side walls disposed on both sides of the sealing area and projecting at a designated thickness to an inside of the electronic device.

19. The electronic device of claim 18, wherein the recess includes:

a first surface disposed adjacent to the through-hole and flush with the sealing area, and a second and third surface extending from both sides of the first surface, and wherein the second surface and the third surface are disposed to face in a direction different from the first surface.

20. The electronic device of claim 18, wherein the rib includes a first surface facing in the first direction and a second surface facing in the second direction, wherein the second surface provides an area for substantially supporting and attaching an edge of the rear plate, and wherein the first surface provides a seating area disposed to face at least a portion of an outer surface of the sealing member.

* * * * *